United States Patent
Marks et al.

(10) Patent No.: US 11,968,772 B2
(45) Date of Patent: Apr. 23, 2024

(54) OPTICAL ETENDUE MATCHING METHODS FOR EXTREME ULTRAVIOLET METROLOGY

(71) Applicant: KLA Corporation, Milpitas, CA (US)

(72) Inventors: Zefram Marks, Gilroy, CA (US); Larissa Juschkin, Pleasanton, CA (US); Daniel C. Wack, Fredericksburg, VA (US)

(73) Assignee: KLA Corporation, Milpitas, CA (US)

( * ) Notice: Subject to any disclaimer, the term of this patent is extended or adjusted under 35 U.S.C. 154(b) by 900 days.

(21) Appl. No.: 16/862,279

(22) Filed: Apr. 29, 2020

(65) Prior Publication Data
US 2020/0383200 A1 Dec. 3, 2020

Related U.S. Application Data

(60) Provisional application No. 62/854,785, filed on May 30, 2019.

(51) Int. Cl.
*H05H 13/04* (2006.01)
*G01N 21/88* (2006.01)
(Continued)

(52) U.S. Cl.
CPC ......... *H05H 13/04* (2013.01); *G01N 21/8806* (2013.01); *G02B 26/085* (2013.01);
(Continued)

(58) Field of Classification Search
CPC ............ H05H 13/04; H05H 7/04; H05H 7/08; H05H 2007/002; H05H 2007/005;
(Continued)

(56) References Cited

U.S. PATENT DOCUMENTS 5,341,104 A  8/1994  Anton et al.
8,941,336 B1  1/2015  Liu et al.
(Continued)

FOREIGN PATENT DOCUMENTS

EP  0447175 B1  11/1997
TW  201833670 A  9/2018
(Continued)

OTHER PUBLICATIONS

PCT International Search Report and Written Opinion for International Application No. PCT/US2020/035032 dated Sep. 15, 2020, 10 pages.
(Continued)

*Primary Examiner* — Isiaka O Akanbi
*Assistant Examiner* — Hsien C Tsai
(74) *Attorney, Agent, or Firm* — Suiter Swantz IP

(57) ABSTRACT

An optical characterization system is disclosed. The optical characterization system may comprise a synchrotron source, an optical characterization sub-system, and a sensor configured to receive a projected image from a set of imaging optics. The optical characterization sub-system may include at least the set of illumination optics, a set of imaging optics, and a diffractive optical element, a temporal modulator or an optical waveguide configured to match an etendue of a light beam output by the synchrotron source to the set of illumination optics. A method of matching the etendue of a light beam is also disclosed.

37 Claims, 15 Drawing Sheets

(51) Int. Cl.
*G02B 26/08* (2006.01)
*G02F 1/11* (2006.01)
*H05H 7/04* (2006.01)
*H05H 7/00* (2006.01)

(52) U.S. Cl.
CPC .................. *G02F 1/11* (2013.01); *H05H 7/04* (2013.01); *G01N 2021/8887* (2013.01); *H05H 2007/002* (2013.01); *H05H 2007/005* (2013.01)

(58) Field of Classification Search
CPC ............ G01N 21/8806; G03F 7/70075; G03F 7/70033; G03F 7/70116; G03F 7/70191
See application file for complete search history.

(56) References Cited

U.S. PATENT DOCUMENTS

| | | |
|---|---|---|
| 2008/0239265 A1 | 10/2008 | Den Boef |
| 2013/0329204 A1 | 12/2013 | Pellemans et al. |
| 2013/0343053 A1 | 12/2013 | Holman et al. |
| 2014/0048707 A1* | 2/2014 | Liu .................. H01J 37/02 315/503 |
| 2014/0146297 A1 | 5/2014 | Vainer et al. |
| 2015/0055110 A1 | 2/2015 | Maul et al. |
| 2015/0355552 A1* | 12/2015 | Saenger .............. G21K 1/067 250/504 R |

FOREIGN PATENT DOCUMENTS

| | | |
|---|---|---|
| TW | 201842415 A | 12/2018 |
| WO | 2016139055 A3 | 9/2016 |
| WO | WO-2018159005 A1 * | 9/2018 .............. G03F 7/20 |

OTHER PUBLICATIONS

Dais, C., "Templated self-assembly of SiGe quantum dots", PHD thesis, RWTH Aachen University, Aug. 19, 2009, 127 pages.
Kim, S. O. et al., "Epitaxial self-assembly of block copolymers on lithographically defined nanopatterned substrates", Nature, vol. 424, Jul. 24, 2003, 4 pages.
Attwood, David et al., "Soft X-Rays and Extreme Ultraviolet Radiation," Chapter Five: Synchrotron Radiation, pp. 172-188; Univ. of California, Berkeley and Lawrence Berkeley National Lab; publication date unknown.
Extended European Search Report dated Dec. 19, 2022 for European Application No. 20814141.6.
Sakhno O.V. et al.; "Holographic patterning of organic-inorganic photopolymerizable nanocomposites,"; Proceedings of SPIE, IEEE, US, vol. 7487, Jan. 1, 2009, pp. 74870H-1.
Suleski, T.J. et al.,; "Emerging fabrication methods for diffractive optical elements," Proceedings of SPIE, IEEE, US. vol. 3633, Jan. 1, 1999, pp. 26-34.
David Attwood, Soft X-Rays and Extreme Ultraviolet Radiation, 1st ed, Cambridge University Press, 1999, pp. 172-188.
Tawain Patent Office, Office Action received in TW Patent Application No. 109117974, dated Oct. 20, 2023, 24 pages (including translation).

* cited by examiner

OPTICAL ETENDUE MATCHING METHODS FOR EXTREME ULTRAVIOLET METROLOGY

CROSS-REFERENCE TO RELATED APPLICATION

The present application claims the benefit under 35 U.S.C. § 119(e) of U.S. Provisional Application Ser. No. 62/854,785, filed May 30, 2019, entitled OPTICAL ETENDUE MATCHING METHODS FOR EUV METROLOGY, naming Zefram D. Marks, Larissa Juschkin, and Daniel C. Wack as inventors, which is incorporated herein by reference in the entirety.

TECHNICAL FIELD

The present disclosure generally relates to wafer and mask optical characterization, and more particularly to a semiconductor wafer inspection system, an actinic EUV mask inspection system or an actinic mask review system equipped with a synchrotron radiation source.

BACKGROUND

Plasma based light sources are commonly implemented to generate extreme ultraviolet (EUV) and vacuum ultraviolet (VUV) light in wafer and mask inspection systems. For instance, discharged-produced plasma (DPP) and laser-produced plasma (LPP) are conventional components in EUV illumination source technologies.

DPP and LPP based light sources possess a number of disadvantages. For example, in order to achieve higher levels of in-band EUV brightness, time-multiplexing of several sources is required, particularly in technologies implementing DPP sources. The time-multiplexing of several sources limits inspection throughput, while simultaneously increasing cost and complexity.

In addition, spectral output in DPP and LPP sources cannot be directly controlled in design or operation, and the pulse repetition rate in LPP and DPP systems is limited by a number of physical constraints, with pulse-to-pulse energy fluctuations being significant. Further, surfaces and materials in close proximity to the plasma of an LPP or DPP source are typically exposed to high energy neutral and ion flux, which sputters and spalls the material. As such, debris and contamination mitigation is typically required to protect the associated downstream optics and mask.

U.S. Pat. No. 8,941,336, which is incorporated herein by reference in its entirety, discloses a synchrotron device, an alternative illumination source that overcomes the deficiencies described above. The synchrotron device includes an electron beam generator, an electron storage ring, and wigglers. The wigglers generate a periodic alternating magnetic field using a plurality of magnetic poles. To produce radiation, the alternating magnetic field accelerates electrons in a direction perpendicular to the direction of the electrons' travel.

Due to the low emittance of the electron beam into the wiggler, the etendue of EUV light emitted from a typical synchrotron may be many orders-of-magnitudes lower than the etendue of the illumination optics in a mask or wafer inspection system. Thus, the angular spread of the beam must be increased to fill the illumination pupil of a mask or wafer inspection system while simultaneously maintaining sufficiently large field of view required for high throughput.

U.S. Pat. No. 8,941,336 describes methods to increase the EUV etendue output of synchrotron wigglers. Using adaptive electron optics, the emittance of the electron beam can be manipulated to increase the etendue of the emitted EUV. The electron beam (or its trajectory) can be manipulated to increase the electron beam size when it enters the wiggler (or the beam size averaged within the detector response time), and to reduce the electron beam size when it enters the synchrotron track again. This manipulation can be done by, for example, expanding the spatial extent of the electron beam through the wiggler or steering the electron beam at high frequency to achieve desired time-averaged beam spatial characteristics.

Although effective, adaptive electron optics are costly and complex to implement. Adaptive electron optics suffer from aberrations when the beam size increases and at much smaller aperture sizes than light optics. To match the etendue of the illumination optics of a wafer and mask inspection system, the electron beam emittance must be increased by many orders of magnitude. This increase requires expanding the beam by comparable amounts. At large beam sizes, it is very difficult to manufacture accelerator and wiggler channels with the correct electric and magnetic fields. Additional electron optics require precise electro-static or magnetic assemblies, increasing the system complexity, cost, and causing risk to reliability.

Thus, an alternative solution to cure the shortfalls of the previous solutions is desirable.

SUMMARY

An optical characterization system is disclosed in accordance with one or more illustrative embodiments of the present disclosure. In one illustrative embodiment, the optical characterization system comprises a synchrotron source. In another illustrative embodiment, the optical characterization system comprises an optical characterization sub-system including at least a set of illumination optics, a set of imaging optics, and a diffractive optical element configured to match an etendue of a light beam output by the synchrotron source to the set of illumination optics. In another illustrative embodiment, the optical characterization system comprises a sensor configured to receive a projected image from the set of imaging optics.

An optical characterization system is disclosed in accordance with one or more illustrative embodiments of the present disclosure. In one illustrative embodiment, the optical characterization system comprises a synchrotron source. In another illustrative embodiment, the optical characterization system comprises an optical characterization sub-system including at least a set of illumination optics, a set of imaging optics, and a temporal modulator configured to match an etendue of a light beam output by the synchrotron source to the set of illumination optics. In another illustrative embodiment, the optical characterization system comprises a sensor configured to receive a projected image from the set of imaging optics.

A method of matching an etendue of a light beam in an optical characterization system is disclosed in accordance with one or more illustrative embodiments of the present disclosure. In one illustrative embodiment, the method comprises generating the light beam using a synchrotron source. In another illustrative embodiment, the method comprises directing the light beam to a diffractive optical element or a temporal modulator. In another illustrative embodiment, the method comprises increasing the etendue of the light beam to match a set of illumination optics using the diffractive optical element or the temporal modulator.

An optical characterization system is disclosed in accordance with one or more illustrative embodiments of the present disclosure. In one illustrative embodiment, the optical characterization system comprises a synchrotron source. In another illustrative embodiment, the optical characterization system comprises an optical characterization sub-system including at least a set of illumination optics, a set of imaging optics, and a hollow optical waveguide configured to match an etendue of a light beam output by the synchrotron source to the set of illumination optics. In another illustrative embodiment, the optical characterization system comprises a sensor configured to receive a projected image from the set of imaging optics.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Synchrotron sources are very bright and deliver radiation power sufficient to maintain several inspection or metrology systems. Low etendue combined with correspondingly high brightness, however, may result in too high instantaneous sample irradiance. This high irradiance may damage a mask or wafer under inspection or characterization, which is undesirable. Typical inspection systems have a larger etendue (field size×angular spread), so that for the same throughput, pixel exposure time is increased and instantaneous peak sample irradiance is reduced (e.g., to be well below the damage threshold).

To overcome the deficiencies of adaptive electron optics, the optics of the EUV light output by the synchrotron may be directly manipulated to increase the etendue of the light, and to match the etendue of the EUV light to the etendue of the illumination optics in a wafer or mask inspection system. This direct manipulation of the light beam may be performed by diffractive or scattering optical elements, and/or temporal modulators.

Optical etendue matching on EUV optics enables the use of synchrotron sources for inspection systems. The etendue matching elements can also perform the function of homogenizing the illumination, or generating arbitrary pupil patterns. Using pure adaptive electron optics requires complex magnetic design and increased magnetic fields. By using an optical technique to modify the angular spread of the EUV light in one or more dimensions, this complexity can be reduced. The easier beam delivery of low-etendue "laser-like" radiation is advantageous because beam distribution between the inspection or metrology systems may be realized by using smaller-size and less expensive optical elements.

There are several challenges when designing optical elements for etendue matching in the EUV spectral range: (a) the high absorption of EUV light in many materials, (2) the absence of refractive lenses for EUV light, and (3) the requirements for high surface and structure quality due to the short wavelength of EUV light, which leads to high manufacturing costs. As a result, most of the solutions that apply to the visible spectral range are not applicable or not directly transferable to the EUV spectral range. Thus, the present disclosure provides the ability to manipulate the etendue of a light beam in the EUV spectral range.

Figure 1A:
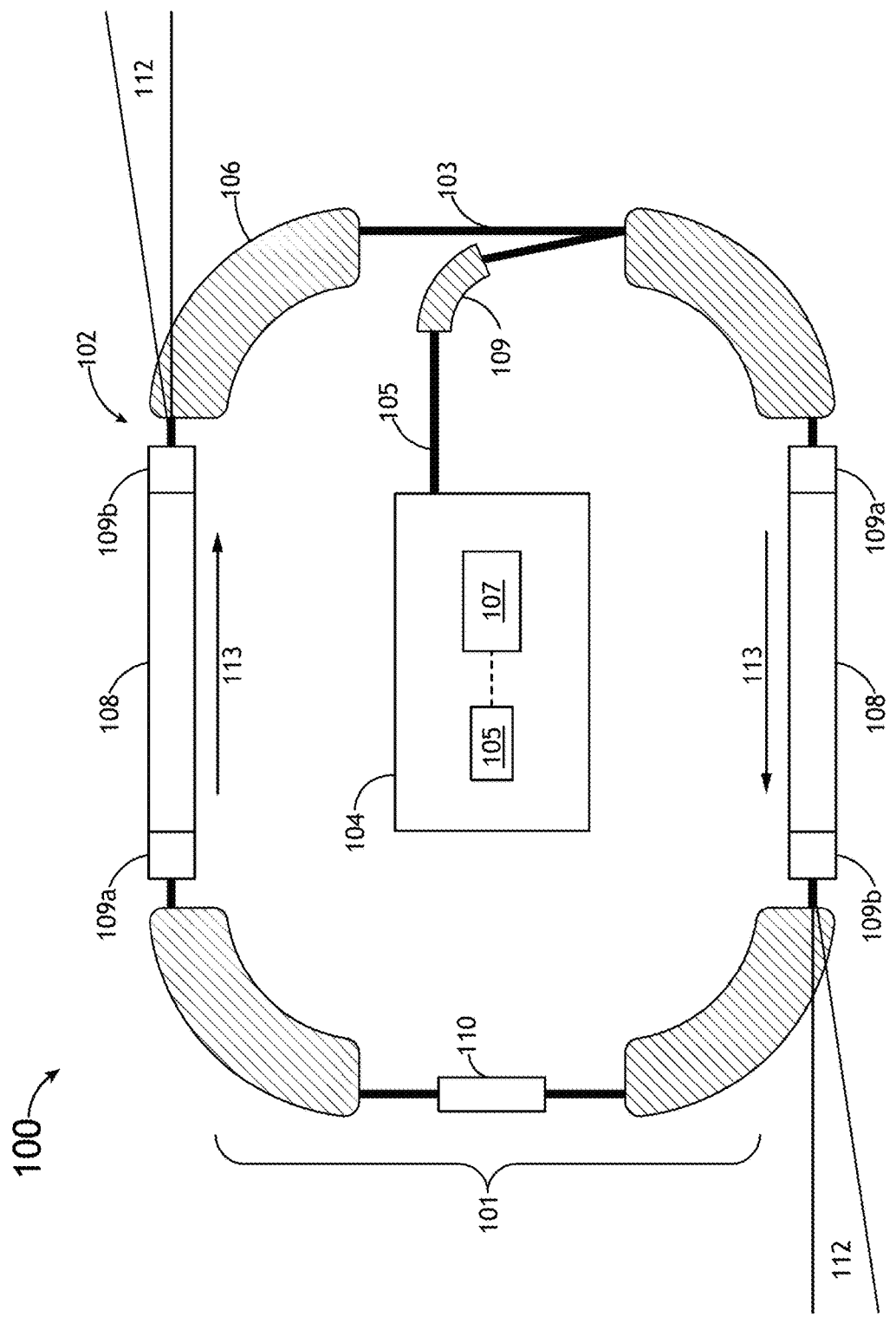
FIG. 1A is a simplified schematic view of a synchrotron radiation source with a wiggler insertion device, in accordance with one or more embodiments of the present disclosure.
Figure 1B:
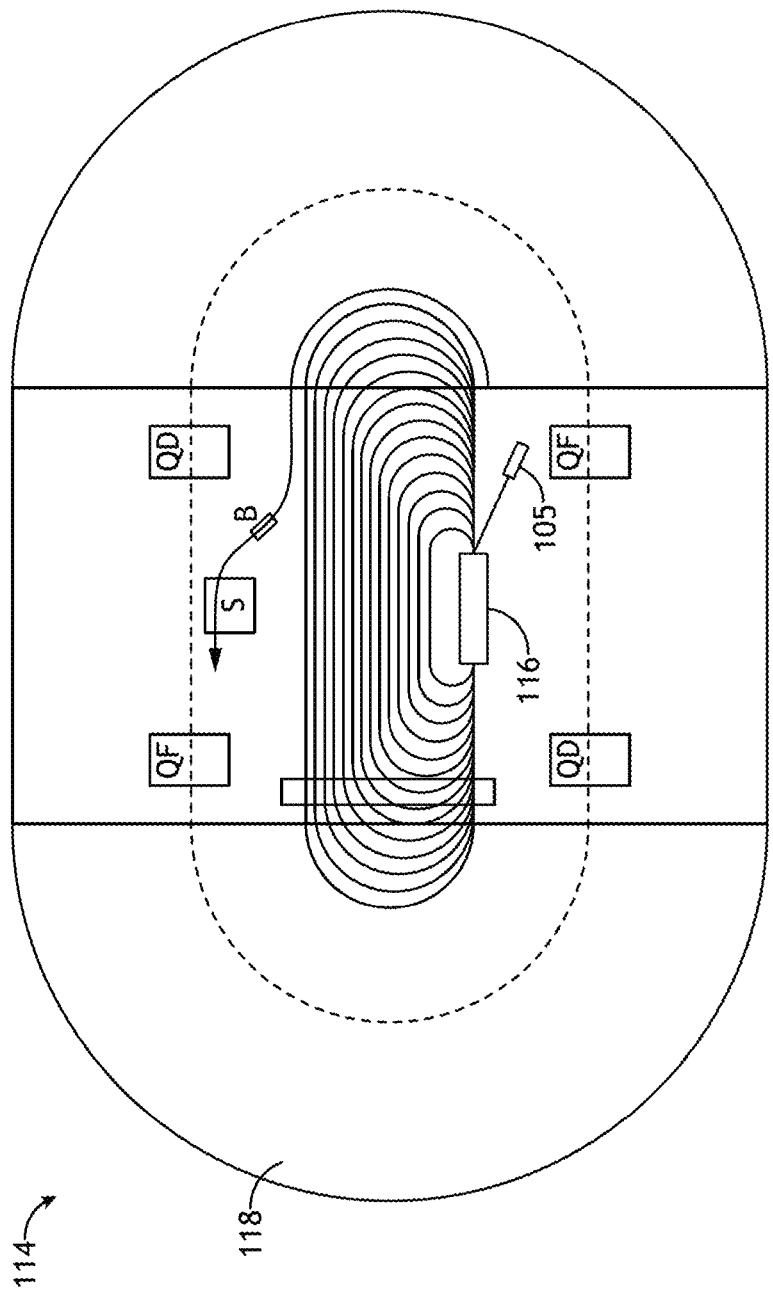
FIG. 1B is a simplified schematic view of a racetrack storage ring combined with a racetrack microtron device, in accordance with one or more embodiments of the present disclosure.
Figure 2:
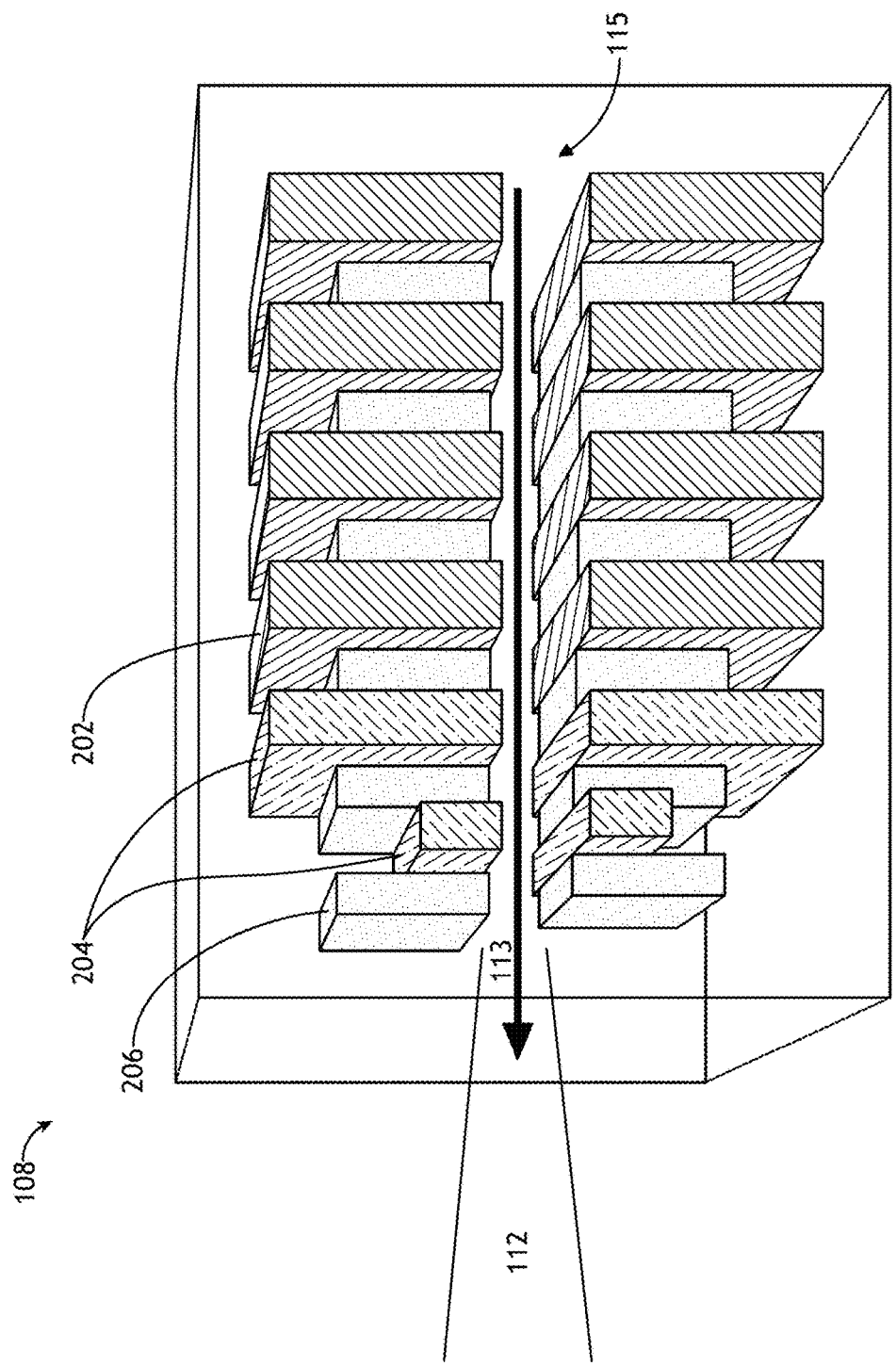
FIG. 2 is a schematic view of a multipole wiggler insertion device, in accordance with one or more embodiments of the present disclosure.

Referring generally to FIGS. 1A through 2, a wiggler based synchrotron radiation source 100 suitable for serving as an illumination source of a semiconductor wafer optical characterization system or a mask optical characterization system is described in accordance with the present disclosure.

Synchrotron radiation results from the acceleration of highly relativistic electrons, such as acceleration of electrons in a magnet field. It has generally shown impractical to use synchrotron sources in EUV-based semiconductor manufacturing processes due to size and power limitations within the spectral bandpass for EUV lithography (e.g., approximately 1-2% at $\lambda$=13.5 nm). However, the unique requirements of broadband semiconductor wafer inspection and narrowband actinic EUV mask inspection (as well as mask metrology [e.g., actinic mask review or EUV reflectometry]) provide a good match between an optimized synchrotron radiation source and an inspection/metrology system.

The present disclosure provides a compact synchrotron radiation source equipped with one or more wiggler-type insertion devices suitable for delivering light (e.g., narrowband or broadband light) to the optical input (e.g., illumination optics) of a wafer inspection system, an actinic EUV mask inspection (AMI) system, an actinic mask review (AMR) system, a mask reflectometer system and the like. Additionally, the present disclosure provides solutions to improve optical coupling (e.g., etendue matching) between a synchrotron radiation source and the optical sub-system of an optical characterization system. This improved optical coupling may be realized by directly manipulating the light output by the synchrotron to increase the etendue of the light (e.g., by using diffractive optical elements and/or temporal modulators), and/or by manipulating the electron beam to indirectly increase the etendue of the light.

In this regard, the embodiments of the present disclosure provide "etendue matching" between the synchrotron radiation source and the optical input of the inspection/metrology system to maximize source utilization and reduce the technical requirements on the synchrotron itself. As such, the etendue of light emitted by a wiggler based synchrotron radiation source may be matched, within an acceptable tolerance level, to the optical input of at least one of a wafer optical characterization system or a mask optical characterization system of the present disclosure.

The present disclosure provides a broadband, selectable, and scalable emission distribution, whereby narrowband illumination is selected for actinic EUV mask inspection (or EUV metrology), with broadband illumination utilized in broadband wafer inspection. Wavelength bands can be selected through various filtering elements (e.g., spectral filters, diffraction gratings and the like) disposed between a photon beam output of the wiggler synchrotron source and the optical input, such as the input of the illumination optics, of a given optical characterization system.

Further, the present disclosure is directed to the implementation of multiple optical characterization systems optically coupled to a single compact wiggler based synchrotron source. For the purposes of the present disclosure an optical characterization system should be interpreted as any optical characterization or measurement system suitable for inspecting, reviewing, characterizing or measuring one or more features of a semiconductor wafer or a lithography mask. For instance, an optical characterization system may be an actinic EUV mask inspection system, a wafer inspection system, or a EUV metrology system, such as, but not limited to, an actinic mask review system or EUV mask reflectometer.

FIG. 1A illustrates a simplified schematic view of the wiggler equipped synchrotron radiation source 100, in accordance with one or more embodiments of the present disclosure. The synchrotron radiation source 100 may include an electron beam generator 104 suitable for generating one or more beams of electrons 105. The electron beam generator 104 may include an electron gun 105 configured to generate electrons, and an electron accelerator device 107. The electron gun 105 may be operably coupled to the electron accelerator device 107 such that electrons generated by the electron gun are injected into the accelerator device 107 for acceleration. The electron accelerator device 107 may include, but is not limited to, a linac device (i.e., linear electron accelerator). The electron accelerator device 107 may include a compact microtron device. As shown in FIG. 1B, a compact microtron device 114 may accelerate electrons utilizing a modified linear accelerator 116 in a racetrack geometry, enabled via the pair of D-shaped magnets 118 (e.g., D-shaped electromagnets). In this regard, the electron gun 105 may emit electrons into the microtron device 114. Then, the electrons are accelerated via the linear accelerator 116 with each pass through the "racetrack" pathway of the microtron device 114. In some embodiments, the microtron device plane may be horizontal or vertical. In some embodiments, the microtron device plane may be arranged such that it is co-planar with the storage ring 101.

Referring again to FIG. 1A, the radiation source 100 of the present disclosure may include a compact electron storage ring 101, in accordance with some embodiments of the present disclosure. In some embodiments, the electron storage ring 101 of the radiation source 100 may include, but is not limited to, a plurality of magnets configured to bend the trajectory of the electrons emitted from the electron beam generator 104 into a closed path about the storage ring 101. For example, as shown in FIG. 1A, once the electrons 105 are injected into the storage ring they may circulate about the closed path 103 about the storage ring 101. In some embodiments, the bending magnets 106 may include, but are not limited to, one or more permanent magnets. In some embodiments, the bending magnets 106 may include, but are not limited to, one or more electromagnets. In some embodiments, the bending magnets 106 may include, but are not limited to, one or more superconducting magnets.

In some embodiments, the electron storage ring 101 plane may be arranged horizontally or vertically. In a further embodiment, the microtron device plane 114 may be arranged such that it is co-planar with the storage ring 101.

In some embodiments, the synchrotron radiation source 100 includes a radiofrequency (RF) system 110 configured to supply energy to the electrons as they circulate about the electron storage ring 101. The RF system 110 may include any RF system known in the art.

In some embodiments, the radiation source 100 includes one or more wiggler insertion devices 108. In some embodiments, each wiggler insertion device 108 of the radiation source 100 is disposed along a straight section of the electron storage ring 101, as depicted in FIG. 1A.

FIG. 2 illustrates a schematic view of a wiggler insertion device 108, in accordance with one or more embodiments of the present disclosure. In some embodiments, the one or more wiggler insertion devices 108 of the radiation source 100 include a plurality of magnetic poles suitable for generating a periodic alternating magnetic field for producing a light beam 112 emitted along the direction of travel 113 of the electrons. The one or more wiggler insertion devices 108 generate the light beam 112 along the direction of travel by accelerating the electrons passing through the gap 115 (e.g., gap between top portion and bottom portion of wiggler insertion device 108) of a given wiggler insertion device 108 periodically along a direction perpendicular to the direction of travel.

In some embodiments, the one or more wiggler insertion devices 108 include a set of main poles 202 and a set of soft magnet poles 206. In a further embodiment, each of the set of soft magnets 206 is interleaved between each adjacent pair of main poles 202. In some embodiments, the main poles 202 are formed from any permanent magnetic material known in the art. In some embodiments, the soft magnet poles 206 may be formed from any soft magnetic material known in the art. For example, the soft magnets 206 may include a cobalt-iron based magnetic alloy, such as, but not limited to, PERMENDUR. In a further embodiment, the one or more wiggler insertion devices 108 include a set of end poles 204. In some embodiments, the set of end poles 204 may be formed from a permanent magnetic material.

It is noted herein that the compact feature of the synchrotron radiation source 100 of the present disclosure is partially enabled via compact wiggler design and/or compact electron storage ring design. In some embodiments, in the case of a permanent magnet (PM) based wiggler insertion device, the size of the PM wiggler insertion device may be manufactured to have a length of approximately 1 to 3 m. It is further recognized that the size required for superconducting magnet (SM) wiggler insertion devices suitable for implementation in the present disclosure may be shorter than PM based wiggler insertion devices.

In some embodiments, the compact design of the synchrotron source 100 of the present disclosure is enabled by various design features of the electron storage ring 101. In some embodiments, the storage ring 101 of synchrotron source 100 may be configured to generate an electron beam having a "low" energy substantially between 100 and 600 MeV and modest current between approximately 100-900 mA. It is noted herein that the choice of low energy for the electron storage ring design allows for a compact electron ring 101 and accelerator 107. In some embodiments, a bending radius of approximately 0.5 m may allow for a compact design of the storage ring 101.

In some embodiments, the synchrotron source 100 may include a set of adaptive electron optics 109a-b configured to manipulate one or more spatial characteristics of the electron beam as it passes through the one or more wiggler insertion devices 108. It is noted herein that the etendue of the light 112 outputted from the one or more wiggler devices is a function of the spatial extent of the electron beam (as it passes through the one or more wiggler insertion devises 108) and the angular extent of the photon beam caused by the operation of the one or more wiggler insertion devices 108 on the electron beam. As such, the etendue of the light beam 112 may be controlled by manipulating the spatial extent of the electron beam. In some embodiments, etendue matching optics (e.g., diffractive optical elements and/or temporal modulators) may control the etendue of the light beam 112 after the light beam exits the synchrotron source 100, in addition to or in the absence of the adaptive electron optics 109a-b.

In some embodiments, the set of adaptive electron optics 109a-b may be configured to match the etendue of the light beam 112 emitted by the one or more wiggler insertion devices 108 to the optical input (e.g., the illumination optics) of an associated optical characterization system by adjusting the spatial extent of the electron beam of the electron storage ring 101 within the one or more wiggler insertion devices 108.

The adaptive electron optics 109a-b may be disposed at both ends of the one or more wiggler insertion devices 108. In a further embodiment, the adaptive electron optics 109a-109b may include a set of entrance optics 109a and exit optics 109b positioned before and after the one or more wiggler insertion devices 108, respectively. It is again noted herein that enlargement of the spatial extent of the electron beam as the electrons pass through the one or more wiggler insertion devices 108 may cause an increase in the etendue of the light beam 112 emitted by the one or more wiggler insertion devices 108. In this regard, the spatial extent of the electron beam can be enlarged by the entrance optics 109a such that the etendue of the light beam 112 emitted by the one or more wiggler devices 108 matches an input of one or more illumination optics of an optical characterization subsystem.

In turn, the one or more exit electron optic devices 109b may collapse the spatial extent of the electron beam upon exiting the one or more wiggler devices 108. In some embodiments, the one or more exit electron optic devices 109b may collapse the spatial extent of the exiting electron beam such that it has a stable orbit in the electron storage ring. In some embodiments, the one or more exit electron optic devices 109b may collapse the spatial extent of the exiting electron beam such that it has a spatial extent substantially similar to the electron beam prior to entrance into the one or more wiggler insertion devices 108. It is noted herein that it is not a requirement of the present disclosure that the exiting spatial extent of the electron beam is substantially matched to the spatial extent of the entrance spatial extent.

Figure 3:
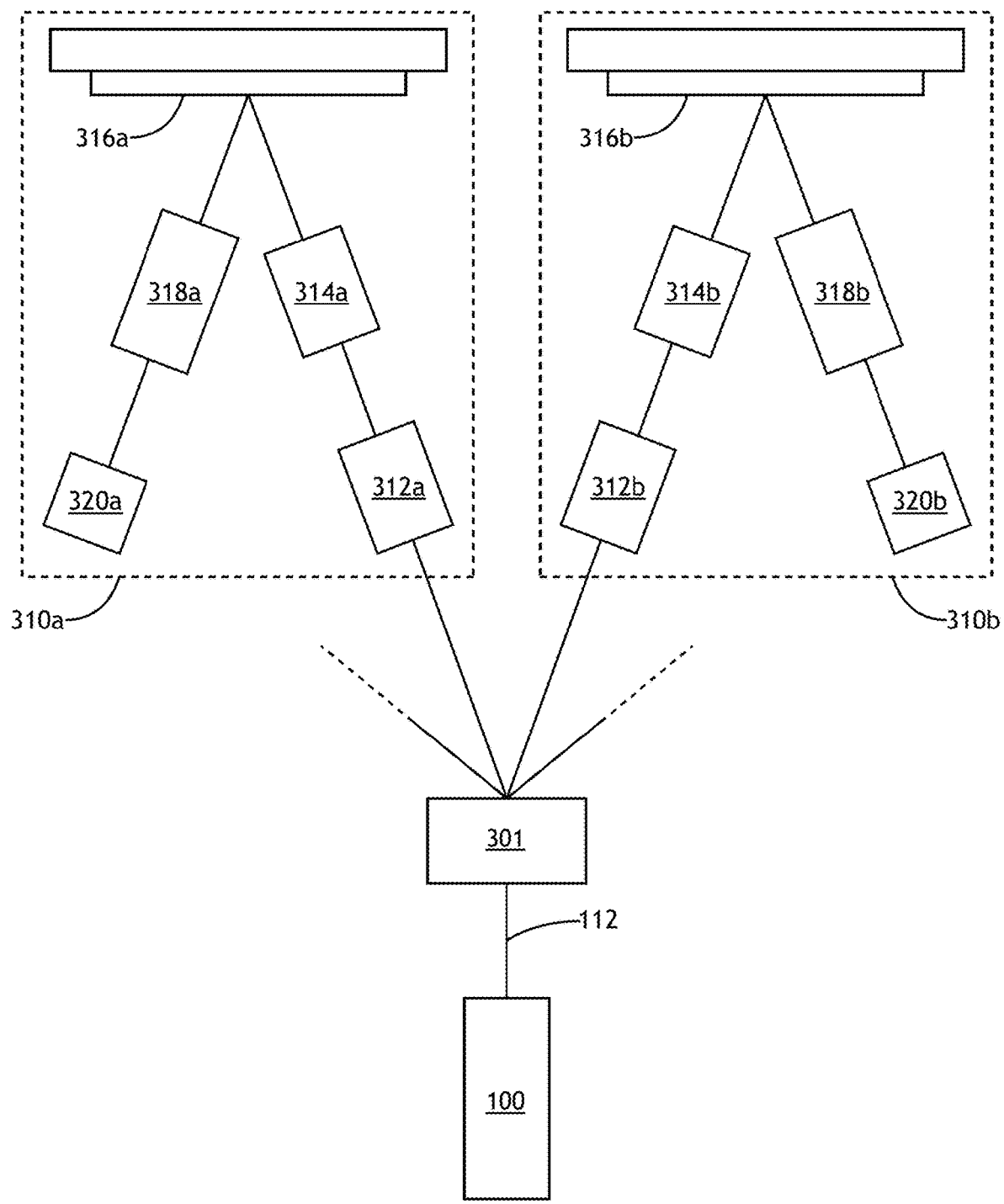
FIG. 3 is a block diagram view of two optical characterization sub-systems equipped with a wiggler synchrotron radiation source, in accordance with one or more embodiments of the present disclosure.

FIG. 3 illustrates a block diagram view of two optical characterization sub-systems 310a-b equipped with the wiggler synchrotron radiation source 100, in accordance with one or more embodiments of the present disclosure. Each of the optical characterization subs-systems 310a-b may respectively include respective etendue matching optics 312a-b, illumination optics 314a-b, masks or wafers 316a-b, imaging optics 318-b, and sensors 320a-b.

After the light beam 112 exits the wiggler synchrotron 100, the beam delivery optics 301 may distribute the light beam 112 to the optical characterization sub-systems 310a-b. The beam delivery optics 301 may include any beam delivery optics known in the art. For example, the beam delivery optics 301 may include, but is not limited to, beam steering optics (e.g., mirrors, beam splitters, lenses and the like) configured to direct the light beam 112 from the wiggler 108 of the synchrotron source 100 to the etendue matching optics 312a-b. For instance, the beam steering optics of the beam delivery optics 301 may include a set of relay mirrors suitable for directing light from the synchrotron source 100 to the etendue matching optics 312a-b.

By way of another example, the beam delivery optics 301 may include, but is not limited to, spectral filtering optics, e.g. one or more diffraction gratings configured to transmit or direct selected wavelength bands of the light beam 112 from the wiggler 108 to the etendue matching optics 312a-b. Due to the narrowband requirements of an actinic EUV mask inspection system (or actinic mask review system), spectral filtering optics or a diffraction grating of the beam delivery optics 301 may be used to selectively filter broadband illumination from the wiggler 108 of source 100 such that only a selected wavelength band (e.g., 13.5 nm EUV) is provided to the illumination optics 314a-b of the mask inspection system 310.

In another embodiment, spectral filtering optics or a diffraction grating of the beam delivery optics 301 may be used to select the centroid wavelength for transmission to the illumination optics 314a-b. The use of the centroid wavelength in the inspection (or review) process may lead to improved accuracy of defect printability estimation. In one aspect, careful choice of the inspection or review wavelength for image acquisition, coupled with a computational model for "wafer- or mask-plane" review, may lead to simpler and more accurate estimates of defect printing. In another aspect, tuning the illumination used in the inspection (or review) process over a wider range, but within the spectral bandwidth of the multilayered surfaces of components of optical sub-systems 310a-b, coupled with photon and electron detectors or spectrometers, provides additional information (e.g., composition information) to the defect classification process.

Inside each of the optical characterization sub-systems 310a-b, the low etendue light beam 112 is sent through respective etendue matching optics 312a-b, which then fills the pupil of the respective illumination optics 314a-b. The illumination optics 314a-b may expose respective masks or wafers 316a-b under inspection or characterization, and the reflected photon beam 112 may be collected by the respective imaging optics 318a-b and imaged onto the respective sensors 320a-b.

The etendue matching optics 312a-b may match the etendue of the light beam 112 to the etendue of the respective illumination optics 314a-b (e.g., by increasing the etendue of the light beam 112) in conjunction with, or in the absence of, the adaptive electron optics 109a-b. The etendue matching optics 312a-b may be diffractive optical elements and/or temporal modulators, and are further described with respect to FIGS. 5-13.

The illumination optics 314a-b may direct the illumination from the delivery optics 301 to respective masks or wafers 316a-b disposed on a stage. In one embodiment, the masks or wafers 316a-b may include, but are not limited to, reflective masks. For instance, the masks or wafers 316a-b may include a reflective mask having a patterned absorbing layer disposed on a resonantly-reflective substrate (e.g., Mo—Si multilayer).

It is noted herein that the illumination optics 314a-b may include any optical components suitable for use in a set of EUV illumination optics. For instance, the illumination optics 314a-b may include, but are not limited to, EUV mirrors (e.g., multilayer mirrors for reflection of EUV light (e.g., 13.5 nm light)) suitable for directing the illumination from the beam delivery optics 301 to the masks or wafers 316a-b. In some embodiments, light reflected and/or scattered from one or more regions of the masks or wafers 316a-b is collected by the respective imaging optics 318a-b. The imaging optics 318a-b may then project an image of the one or more illuminated portions of the respective masks or wafers 316a-b to the respective sensors 320a-b. In some embodiments, the imaging optics 318a-b may include any optical components suitable for use in a set of EUV projection optics. For instance, the projection optics may include, but are not limited to, a series of EUV mirrors suitable for projecting the image of one or more portions of the respective masks or wafers 316a-b onto an imaging region of the respective sensors 318a-b.

In some embodiments, the sensors 318a-b may include any EUV-sensitive sensor known in the art. For example, the sensors 318a-b may include, but are not limited to, CCD sensors. By way of another example, the sensors 318a-b may include, but are not limited to, a TDI-enabled CCD sensor (e.g., TDI-enabled silicon CCD sensor). It is noted herein that the presence of defects in or on the masks or wafers 316a-b may cause a change in the reflection or scattering of photons by the masks or wafers 316a-b, thereby altering one or more portions of the image acquired by the sensors 320 and 320b. It is further noted that the sensitivity of the actinic EUV mask inspection process is linked to the number of photons interacting with the given defect, through the statistical fluctuations in the recorded photons per image pixel (i.e., the shot noise effect). As such, it is desirable to utilize high brightness illumination sources in inspection systems.

In some embodiments, one or more computational systems (not shown) may be communicatively coupled to the sensors 320a-b. For example, the one or more computational systems may include one or more computer processors, a memory for storing data and program instructions for directing the one or more processors to carry out the various data processing steps described throughout the present disclosure. In this regard, the one or more processors of the computational system may receive one or more signals from sensors 320a-b indicative of inspection data received by the sensors 320a-b. In turn, the computation system may execute one or more processing and analysis routines to process and analyze the detected data for mask (or wafer) inspection (e.g., pattern inspection or defect detection).

The etendue of the light beam 112 emitted by the multi-pole wiggler 108 of the synchrotron source 100 may be controlled in any manner known in the art. In some embodiments, the set of etendue matching optics 312a-b of the sub-systems 310a-b may match the etendue of the light beam emitted by the wiggler 108 of the wiggler synchrotron source 100 with an optical input needed for inspection or review process. It is recognized herein that the etendue matching optics 312-a-b may aid in maximizing source utilization, while reducing the technical demands on the synchrotron source 100.

In some embodiments, the etendue of the light beam 112 from the wiggler 108 of the synchrotron source 100 may be controlled by manipulating the spatial characteristics of the electron beam of the synchrotron 100. In this regard, the phase space distribution of the electron beam in the storage ring 101 may be manipulated to control the etendue of the EUV light beam 112 emitted by the synchrotron 100. Phase space distribution manipulation provides a flexible and lossless way to fill the illumination pupil of the illumination optics 314a-b of the sub-systems 310a-b. In this regard, the etendue of the light beam 112 entering the illumination optics 314a-b may be set at a selected level through the choice of the focusing magnet design in the storage ring 101. For instance, the etendue of the light beam 112 entering the illumination optics 314a-b may be set at a level required by the given inspection system architecture through the choice of the focusing magnet design in the storage ring 101. It is noted herein that this ability results from the fact that the angular distribution (e.g., on the order of 1 mrad) of the light beam 112 emitted by the wiggler 108 is created by the periodic excursions of the electron beam passing through the wiggler 108. It is further noted that the periodic excursions of the wiggler beam are much larger than the divergence angle of the electron beam (e.g., on the order of 1 μrad).

As previously described, the wiggler synchrotron source 100 may include the set of adaptive electron optics 109a-b configured to match the etendue of the light beam 112 emitted by the one or more wiggler insertion devices 108 to the respective optical inputs (e.g., set of illumination optics 314a-b) of the sub-systems 310a-b. Again, the adaptive electron optics 109a-b may match the etendue of the light beam 112 to the set of illumination optics 314a-b by adjusting one or more spatial characteristics of the electron beam of the electron storage ring 101. For example, the set of adaptive electron beam optics 109a-b may increase the etendue of the light beam 112 by enlarging the spatial extent of the electron beam as it passes through the one or more wiggler insertion devices 108.

In one embodiment, the entrance optics 109a and exit optics 109b of the adaptive electron optics may include, but are not limited to, a set of skew quadrupole magnets positioned before and after the one or more wiggler insertion devices 108 respectively. In this regard, the skew quadrupole magnets are suitable for generating an electron beam having a size sufficient to generate a light beam 112 that matches the requirements of the sub-systems 310a-b.

In some embodiments, the adaptive electron optics 109a-b may include, but are not limited to, a set of electromagnet beam modulating devices positioned before and after one or more wiggler insertion devices 108. In this regard, the set of electromagnet beam modulating devices is configured to steer the electron beam in high frequency such that the averaged (within detector response time) beam spatial characteristics are sufficient to generate a light beam 112 that matches the requirements of the sub-systems 310a-b.

In some embodiments, under equilibrium, or "natural" conditions of electron beam emittance, the design of a magnet "lattice" of the synchrotron source 100 may provide the required etendue of light emitted by the wiggler insertion device 108. The use of a magnet lattice in a synchrotron source to control etendue is described in David Attwood, *Soft X-Rays and Extreme Ultraviolet Radiation*, 1st ed, Cambridge University Press, 1999, pp. 172-188, which is incorporated herein by reference in its entirety.

In some embodiments, the etendue of the light beam from the wiggler 108 of the synchrotron source 100 may be controlled via spectral dispersion of the light emitted by the wiggler insertion device 108. The bandwidth required (e.g., 1-2%) by an actinic EUV mask inspection system may be selected from the broadband output of wiggler 108 via first-order diffraction from a diffraction grating. In some embodiments, for a given bandwidth, the angular dispersion of the diffraction grating (not shown) is matched to the entrance (pupil) aperture for the illumination optics 314a-b.

In some embodiments, the power required for each of the sub-systems 310a-b is given by the product of the required brightness of the respective sub-systems 310a-b and the etendues of the respective systems 310a-b. In turn, each of the etendues of the respective systems 310a-b consists of the product of the acceptance solid angle and the illumination area of the respective sub-system 310a-b.

In the context of actinic EUV mask inspection, a given mask is generally raster-scanned with only a small region of the given mask being illuminated at a given time. The etendue of an actinic EUV mask inspection system is typically small, leading to simultaneous modest average power and high brightness of the inspection system. For example, to support a high throughput of 1 hour/mask, while utilizing only a few TDI-CCD based sensors, the illumination source of a typical actinic EUV mask inspection system should have a brightness of approximately 100 W/(mm²-Sr). In comparison, a Xe-based discharge-produced-plasma (DPP) source may have an available brightness of about 5-10 W/(mm²-Sr), while a Xe-based laser-produced-plasma (LPP) source may have an available brightness of approximately 25 W/(mm²-Sr). However, the average power requirement of a typical actinic EUV mask inspection system is approximately 0.2 to 2 W, resulting from the small etendue (e.g., 1 to 4×10⁻³ mm²) required by a typical actinic EUV mask inspection system.

It is noted herein that the etendue of a typical actinic EUV mask inspection system is generally orders of magnitude higher than that of a typical synchrotron radiation light beam. It is further noted that the etendue of a synchrotron radiation source is produced by the convolution of electron beam emittance (which can be tailored over a wide range) and the synchrotron emission (which has small angular distribution). As such, the design of the compact synchrotron source 100 of the present disclosure may be optimized (or at least improved to a sufficient level) for actinic EUV mask inspection (as well as broadband wafer inspection) through the design of the electron optics of the electron storage ring 100 and the wiggler insertion device 108.

It is further noted herein that the multipole wiggler insertion device 108 of the present disclosure allows for generation of EUV light in all periods. As such, the multipole wiggler insertion device 108 provides a direct path to increase broadband power in a given optical characterization system (e.g., actinic EUV mask inspection system or wafer inspection system). The in-band EUV power (in watts) for actinic EUV mask inspection (e.g., 2.5% bandwidth at 13.5 nm) from a wiggler insertion device is given by:

$$P = (1.4\ W) \cdot L \cdot B \cdot I \cdot G1\left(\frac{E}{E_c}\right)$$

Where L is the total wiggler length (m) and given by L=NL$_w$, where N is the total number of periods and L$_w$ is the size of wiggler period (m). In addition, B is the peak magnetic field in the wiggler (T), I is the beam current (A) and G1 is an energy dependence factor in which E is the photon energy (e.g., for 13.5 nm light the energy is 92 eV) and E$_c$ represents the critical energy, given by E$_c$=(665 eV)·E$_e^2$·B, where E$_e$ is the electron beam energy (in GeV). The wiggler insertion devices are described in David Attwood, *Soft X-Rays and Extreme Ultraviolet Radiation*, 1st ed, Cambridge University Press, 1999, pp. 172-188, which is incorporated herein by reference in its entirety.

Further, in settings where the energy of the storage ring 101 is chosen for peak output for actinic EUV mask inspection purposes, significant broadband output at longer wavelengths (e.g., 100-200 nm) suitable for wafer inspection is also produced.

In one embodiment, a compact low-energy wiggler synchrotron source 100, as described throughout the present disclosure, may possess the following parameters: E$_e$=270 MeV, B=2 T (permanent magnet level), L=1 m, N=6, L$_w$=16 cm, and I=200 mA. Based on the equation provided above, such a set of parameters may produce EUV in-band power at 0.4 W, which is adequate for current actinic EUV mask inspection needs. Applicants note that the listed synchrotron source parameters are provided merely for illustrative purposes and should not be interpreted as limitations on the present disclosure.

In one embodiment, a compact low-energy wiggler synchrotron source having characteristics as listed above may have beam divergence angles such as 1.9 (v)×101 (h) mrad. In the case of actinic EUV mask inspection, etendue requirements may require beam sizes of approximately 4400 (v)× 100 (h) μm. Applicants note that such a beam is generally large by typical synchrotron standards. Such a configuration allows collection of increased current due to the effective elimination of the etendue limit on the electron gun, thereby leading to reduced storage ring fill times.

It is noted herein that the total radiated power of the wiggler 108 when integrated over all frequencies may be on the order of 10-100 W. It is further recognized herein that the power inputted into the illumination optics 314a-b of the sub-systems 310a-b may be regulated utilizing various filtering methods. For example, an absorber incorporated into the beam delivery optics 301 may be used to regulate power inputted into the illumination optics 314a-b. By way of another example, a diffraction grating may be used to regulate power inputted into the illumination optics 314a-b.

In some embodiments, an undulator (not shown) may be disposed in the pathway of the electron storage ring 101 of the synchrotron source 100. It is noted herein that in narrow-band systems (e.g., actinic EUV mask inspection system or actinic mask review system), where out-of-band radiation is of concern, an undulator may be utilized within the storage ring 101 of the synchrotron source 100. The utilization of an undulator within the storage ring 101 may provide improved radiation properties. For example, the use of an undulator may provide cleaner and tunable radiation centered at a desired wavelength emitted by the source 100.

In some embodiments, the light beam 112 emitted by the wiggler insertion device 108 is linearly polarized. It is noted herein that the Brewster angle for EUV light (e.g., λ=13.5 nm) is close to 45°. As such, for an unpolarized beam incident at 45° on a turning mirror, p-polarized light within the incident beam is absorbed. As a result, the angles of incidence of the light on multilayer-coated mirrors are restricted to small values (i.e., "normal incidence" mirrors). In one embodiment, these losses can be avoided for large angles of incidence by restricting beam turning to a single plane and orienting the wiggler field such that it provides an s-polarized output.

Figure 4:
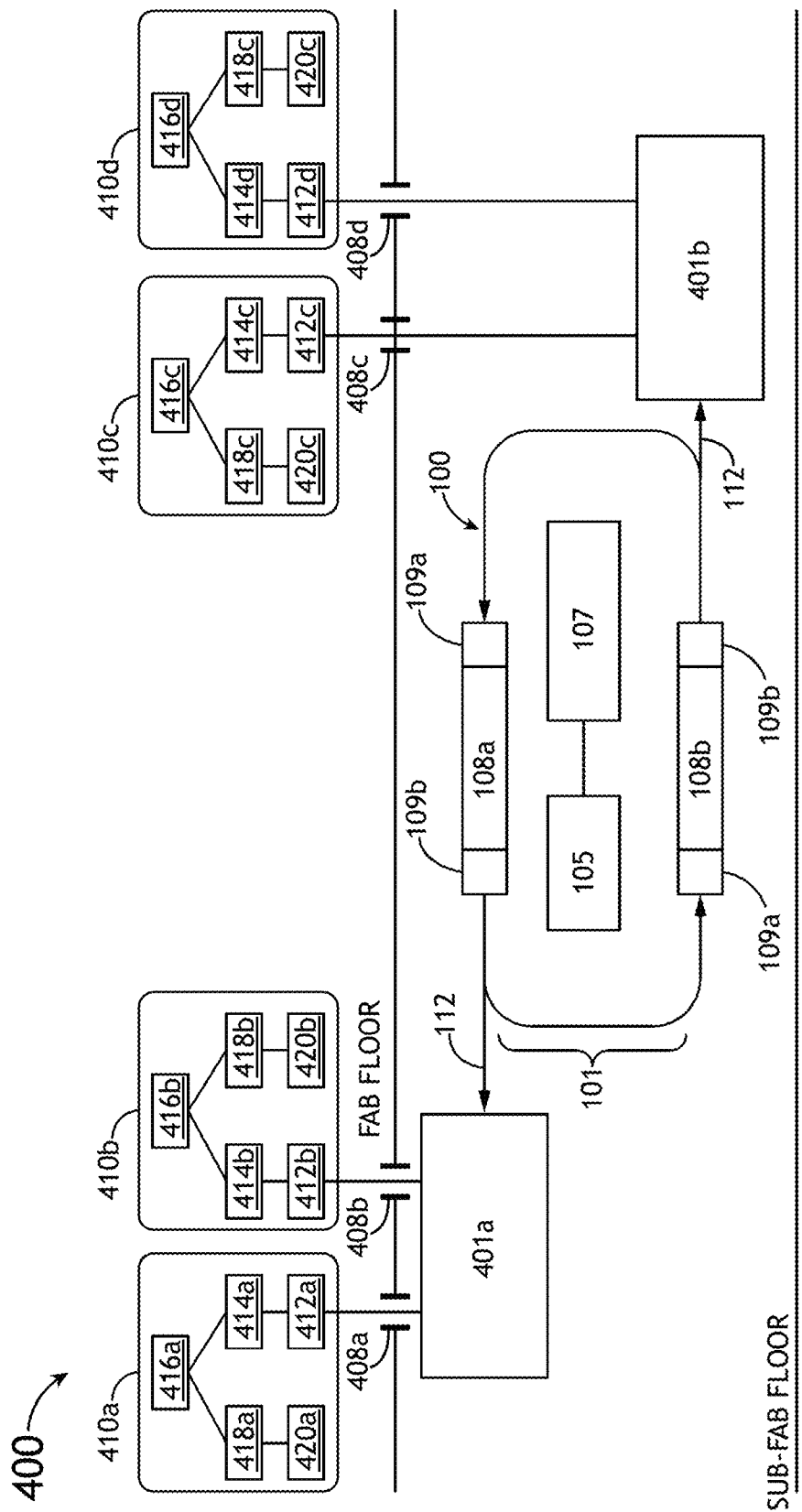
FIG. 4 is a block diagram view of four optical characterization sub-systems equipped with a wiggler synchrotron radiation source, in accordance with one or more embodiments of the present disclosure.

FIG. 4 illustrates a block diagram view of a system 400 including multiple optical characterization sub-systems 410a-d. The optical characterization sub-systems 410a-d may each respectively include etendue matching optics 412a-d, illumination optics 414a-d, masks or wafers 416a-d, imaging optics 418a-d, and sensors 420a-d. The components of the optical characterization sub-systems 410a-d may be substantially identical in form and function to the similarly-named components of the optical characterizations subsystems 310a-b described with respect to FIG. 3.

The optical characterization sub-systems 410a-d may be optically coupled to a single wiggler synchrotron radiation source 100 with the electron storage ring 101 arranged below the multiple optical characterization sub-systems 410a-d. The electron storage ring 101 of the synchrotron radiation source 100 may be arranged below the fab-floor in a sub-fab floor. The beam delivery optics 401a-b may deliver light through pass-throughs 408a-d to the respective etendue matching optics 412a-d of each optical characterization sub-system 410a-d. The beam delivery optics 401a-b may be substantially identical in form and function to the beam delivery optics 301 as described with respect to FIG. 3.

It is noted herein that any number of inspection/metrology systems may be implemented within the context of system 410. The system 410 may implement any one of the various optical characterization sub-systems described throughout the present disclosure. Further, system 410 may simultaneously implement different types of optical characterization sub-systems. Each of the optical characterization sub-systems 410a-d may be a semiconductor wafer inspection system, an actinic EUV mask inspection system, or an actinic mask review system. In one example, the subsystems 410a-b are narrowband (e.g., narrowband achieved using spectral filtering) actinic EUV mask inspection systems, the subsystem 410c is a EUV mask review system, and the subsystem 410d is a broadband wafer inspection system.

As described above, the adaptive electron optics 109a-b in the synchrotron 100 may indirectly manipulate the etendue of the light beam 112 (e.g., by manipulating the electron beam in the synchrotron 100). In some embodiments, the etendue matching optics 312a-b (described with respect to FIG. 3) and etendue matching optics 412a-d (described with respect to FIG. 4) may directly manipulate the etendue of the light beam 112 in conjunction with, or in the absence of, the adaptive electron optics 109a-b.

In some embodiments, the etendue matching optics 312a-b and 412a-d may comprise diffractive optical elements (DOEs). Diffractive optical elements (DOEs) are surface structures patterned onto a transmissive or reflective optical element. The pattern spatially modulates the phase and/or amplitude of the optical wave. DOEs may be patterned onto the substrate of a reflective EUV mirror (normal or grazing incidence), patterned into the multilayer (ML) of a reflective mirror, or patterned onto a transmissive thin-film. The diffractive pattern may be binary (e.g., structure height determined by etch depth), gray-scale (more than one step height), or blazed (triangular angled feature), or exhibit other more complex height profiles.

Possible functional DOEs for etendue matching may include beam diffusers or diffractive optics. Examples of EUV beam diffusers in a transmission mode include thin-film filters with spin-coated nanoparticles, and examples of EUV beam diffusers in a reflection mode include mirrors of known (suitable) roughness characteristics. Examples of diffractive optics include phase zone plates or specially designed scattering holograms having a transmission or reflection geometry.

Diffractive structures may be made in various patterns of binary or variable thickness. The diffractive structure may be absorptive, or phase shifting (and less-absorptive). The DOE may be used in a transmission mode or a reflective (grazing or normal incidence) mode. Experimentally, the diffraction efficiency of phase gratings in a transmission mode may be higher than 40%.

Structured multilayer mirrors may be used as diffractive elements of high efficiency in reflection geometry. When DOEs in grazing incidence geometry are used, the natural asymmetry of the synchrotron output beam (e.g., light beam 112) in the x and y directions may be compensated by the asymmetry of in-plane and out-of plane (conical) diffraction/scatter patterns to provide a symmetric pupil fill.

When a phase-modulating DOE is comprised of a low-absorption material, diffraction efficiencies in different diffraction orders may be optimized by adjusting the height of the structures in order to achieve the desired pupil fill. For example, by choosing the height of the structures to provide phase shift close to π, zero order beam intensity may be significantly reduced with a large fraction of the energy re-directed into higher diffraction orders.

In some embodiments, the optical surface of the DOE may be a one-dimensional regular pattern (spatially varies in one direction, e.g., lines and spaces), or a two-dimensional regular pattern (varies in two spatial directions, e.g., dots or other regularly spaced features).

In some embodiments, the optical surface of the DOE may be a random pattern with a programmed size distribution. The size distribution of features on the surface can be characterized with the power spectral density function. The random pattern may comprise deposited nanoparticles (monodispersed or polydispersed) of a known size distribution. The size distribution, material composition (which determines phase shift) and density of nanoparticles may be chosen and optimized to achieve the desired pupil fill. The random pattern may be produced by controlling the surface finish, i.e., roughening the surface, by, for example, chemical or plasma etching or laser ablation. The random (or ordered) pattern may be produced by using a self-assembly technique on a non-patterned (or pre-patterned) surface, e.g., ordering of block-copolymers or quantum dots growth.

Figure 5:
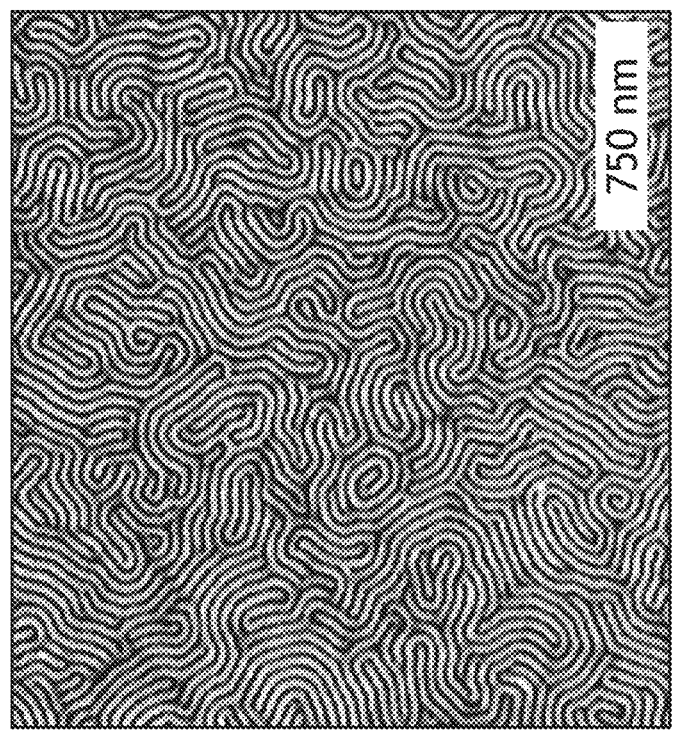
FIG. 5 shows a scanning electron micrograph (SEM) image of block-copolymer surface, in accordance with one or more embodiments of the present disclosure.
Figure 6:
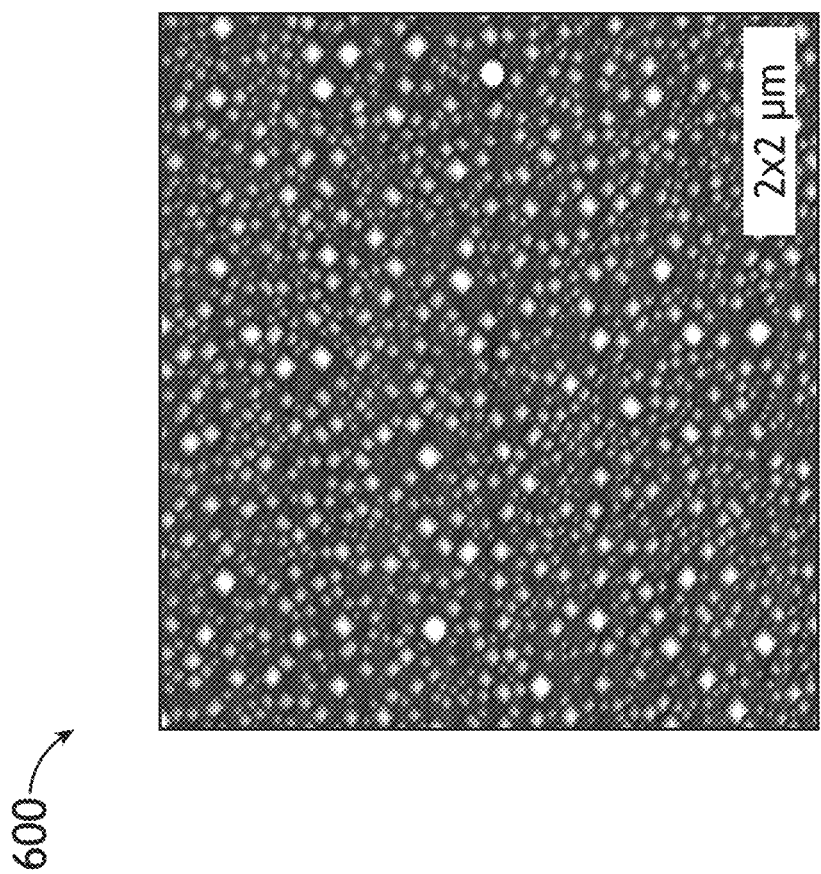
FIG. 6 shows a scanning electron micrograph (SEM) image of a random nanoparticle surface, in accordance with one or more embodiments of the present disclosure.

FIG. 5 shows a scanning electron micrograph (SEM) image 500 of a block-copolymer surface that may be used as a diffusive diffractive surface in a DOE (S. O. Kim et al, *Nature* 424, 411 [2003]). FIG. 6 shows an SEM image 600 of a random nanoparticle pattern (quantum dots grown on a non-patterned substrate) that may be used as a diffusive diffractive surface in a DOE (C. Dais, "*Templated Self-Assembly of SiGe quantum dots*", PhD thesis, RWTH Aachen University [2009]).

In some embodiments, the surface of the DOE may be a programmed pattern called a holographic pattern. The holographic pattern is generated from the desired projected pattern by computing the inverse of the diffraction pattern. The programmed pattern may be a continuous pattern, or a binary or gray-scale approximation of the pattern (digital holography). The programmed pattern may be made using lithography.

In some embodiments, the DOE may be an optical diffuser of the EUV light. The diffuser is designed to uniformly fill the illumination pupil (e.g., the illumination optics 314a-b or 414a-d) and match the etendue of the inspection system. The DOE may create an arbitrary projected pattern. For example, the DOE may project a discrete number of uniform tiled illumination fields with a programmed separation. These tiled illumination fields may illuminate a set of tiled sensors (e.g., the sensors 320a-b and 420a-d) in the inspection system camera (each field matches a separate detector). The DOE may create an arbitrary fill pattern to simulate different pupil apertures (e.g., annular, bipolar, etc.) of the illumination system (e.g., sub-systems 310a-b and 410a-d).

In addition to increasing the etendue of the illumination system, the DOE may be used to split an incident beam (e.g., beam 112) into a discrete number of beams in a regular pattern. Using a DOE (e.g., a grating in conical diffraction), the incident beam 112 may be evenly split into one or more beams. This splitting may illuminate tiled sensors, or may split the light beam 112 from the synchrotron 100 to distribute the light power to multiple inspection sub-systems (e.g., sub-systems 310a-b and 410a-d).

Figure 7:
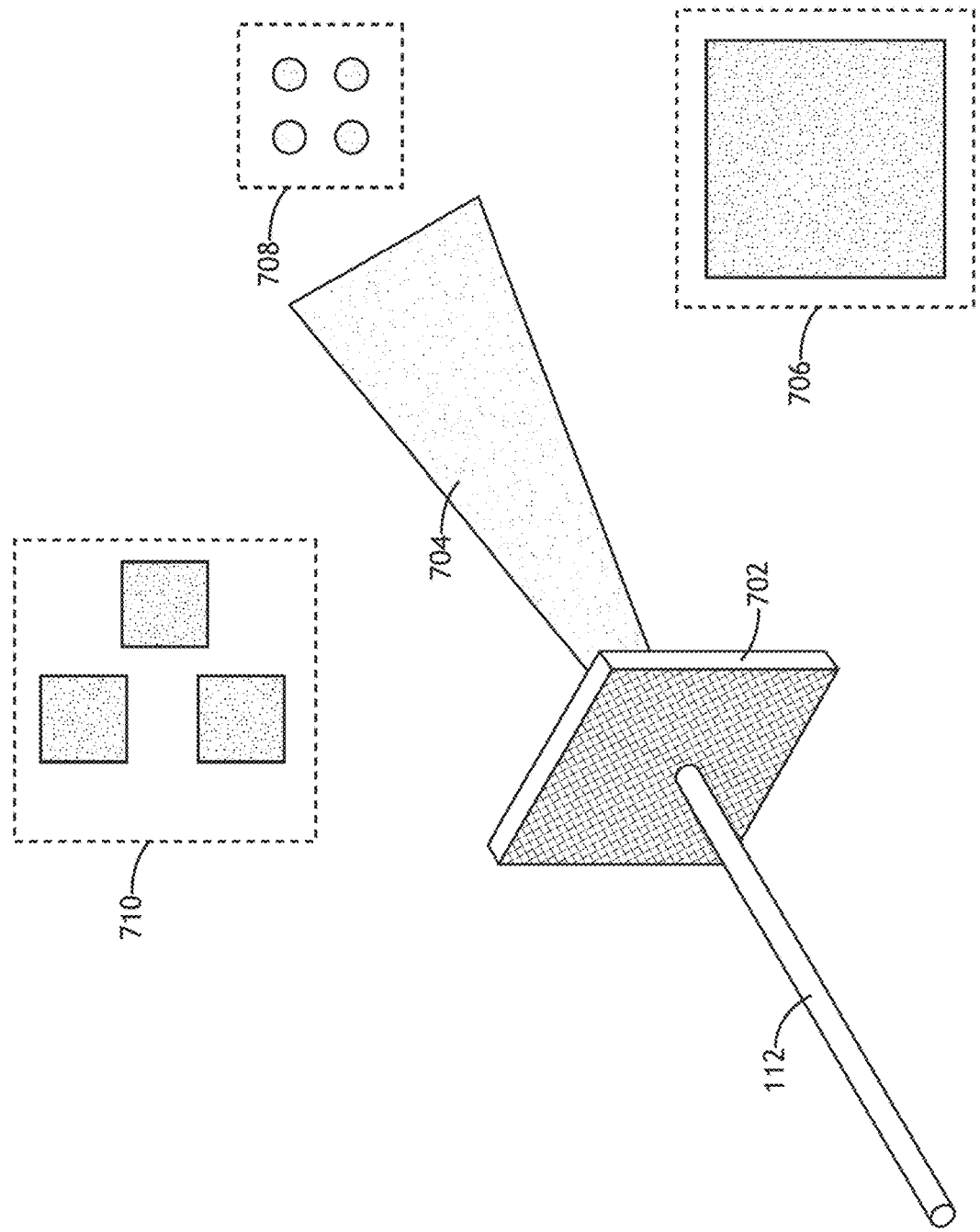
FIG. 7 shows a diffractive optical element configured for etendue matching, in accordance with one or more embodiments of the present disclosure.

FIG. 7 shows a DOE 702 configured to match (e.g., increase) the etendue of the low etendue, high aspect ratio asymmetric light beam 112 that is incident on the DOE 702. The output light beam 704 is engineered to fill an illumination pupil of a set of illumination optics. The projected output light may be a homogeneously filled region (pattern 706), a set of discrete points (pattern 708), or an arbitrary pattern (pattern 710).

Figure 8:
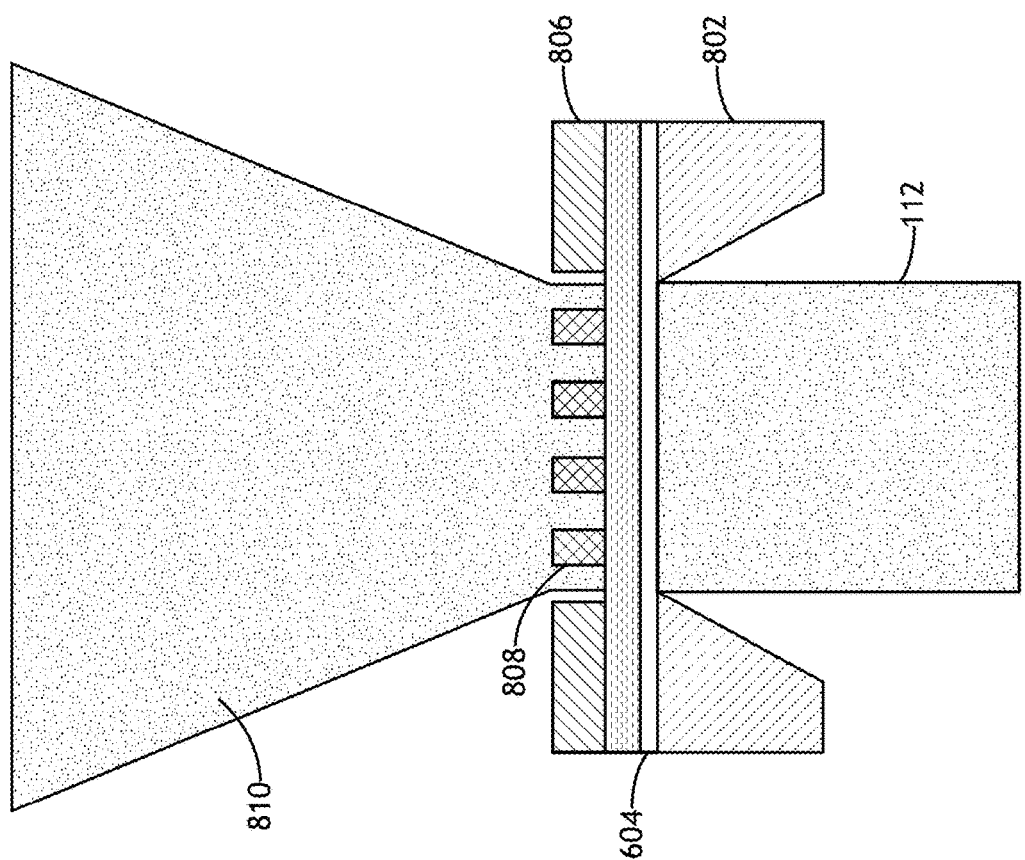
FIG. 8 shows a diffractive optical element including a diffractive material patterned on top of a transmissive membrane, in accordance with one or more embodiments of the present disclosure.

FIG. 8 shows a transmissive DOE 800 configured to match (e.g., increase) the etendue of the low etendue, high aspect ratio asymmetric light beam 112 that is incident on the DOE 800. The output light beam 610 is engineered to fill an illumination pupil of a set of illumination optics. The transmissive DOE 800 may comprise a back-thinned substrate 802, a transmissive thin membrane material 804 (which may consist of several layers of different materials to optimize mechanical stability and transmission in the desired spectral band), an absorbing material 806 (which may define an aperture), and diffractive structures consisting of an absorptive or phase-shifting material 808 (which may be also layered). The diffractive structures 808 may be patterned on top of the transmissive thin membrane material 804. The substrate 802 may include silicon, the thin membrane material 804 may comprise silicon nitride, the transmissive material may comprise molybdenum, and the absorptive or phase-shifting material 808 may comprise nickel (if absorptive) or molybdenum (if phase shifting). It is noted that the substrate 802 and membrane material 804 as well as absorptive or phase-shifting material 808 are not limited to the materials listed herein. Rather, the scope of the present disclosure may extend to any substrate, membrane, absorptive and phase-shifting material known in the art.

Figure 9:
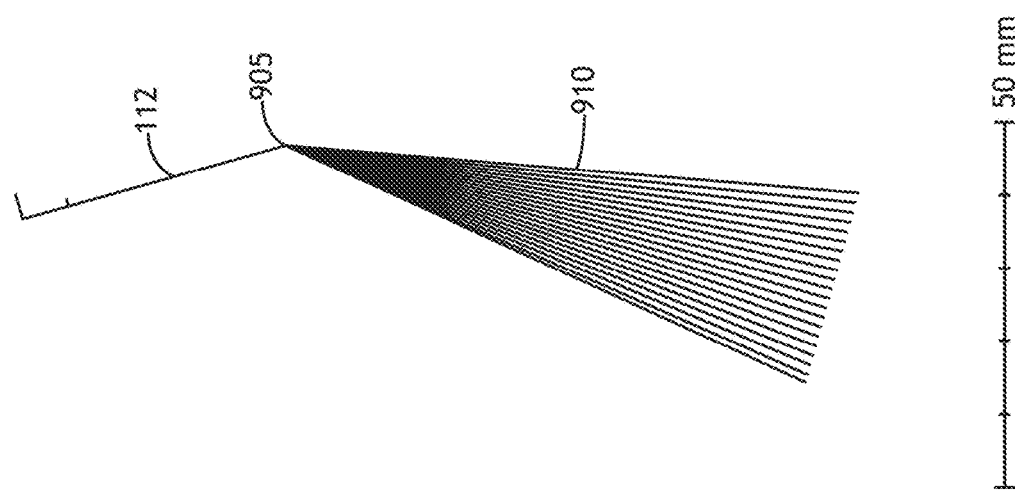
FIG. 9 shows a beam diffuser with a Gaussian scattering distribution illuminated with a zero-divergency beam, in accordance with one or more embodiments of the present disclosure.
Figure 10:
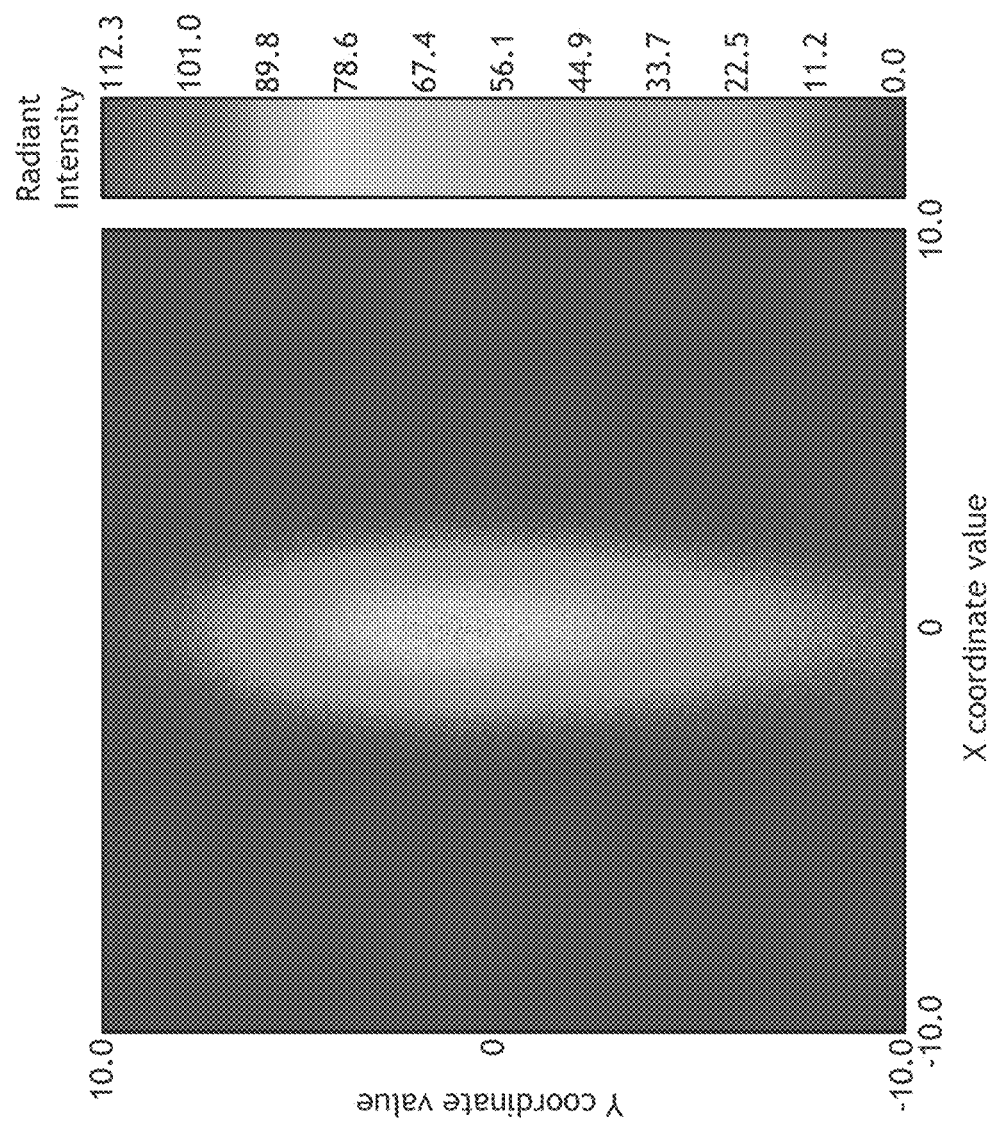
FIG. 10 shows the calculated beam divergency after the beam diffuser of FIG. 9 is illuminated, in accordance with one or more embodiments of the present disclosure.

FIG. 9 shows a (reflective) beam diffuser 905 with a Gaussian scattering distribution illuminated with the zero-divergency light beam 112 in a grazing incidence geometry, and an output beam 910. FIG. 10 shows the calculated beam divergency (in degrees) of the output beam 910. The beam diffuser 905 may include a ruthenium coating with a thin capping layer, which results in a grazing incidence reflectivity of about 80% at a 15-degree angle of incidence to the surface. The incident power is 1 W and the total reflected or scattered power hitting the detector is 0.79 W.

A low etendue light source (e.g., synchrotron 100) implies that the output light has a high spatial coherency. The illumination of surfaces, including diffraction patterns, with high coherency light (e.g., light beam 112) may introduce speckle patterns in the projected image due to the unique nanostructure of the optical element. To generate a uniform projected optical field in a diffuser, the speckle pattern must be broken or mitigated. The speckle pattern may be mitigated by temporally changing the illuminated pattern so that the source beam is incident on a unique surface, creating a new unique speckle pattern, or view. The time-averaged projected pattern is the sum of all these unique views, creating a uniformly illuminated optical field.

In some embodiments, the speckle pattern may be mitigated by vibrating the DOE over some amplitude. This vibration may be in one, two, three, four, five or six degrees of freedom. The vibration may be implemented using, for example, a galvanometric, piezo, or motor actuator, depending on the amplitude and frequency required to generate a sufficient number of views.

In some embodiments, the speckle pattern may be mitigated by using a rotating surface. Here, the diffracting pattern is on a large surface, and only a fraction of the total surface is illuminated at each time moment. The DOE is spun at some rate so that a sufficient number of unique views are generated. These views may be generated by patterning the DOE on the surface of a disk, or on the edge of a wheel.

The light may be transmitted through or reflected (normal or grazing incidence) from these spinning or vibrating elements.

Figure 11:
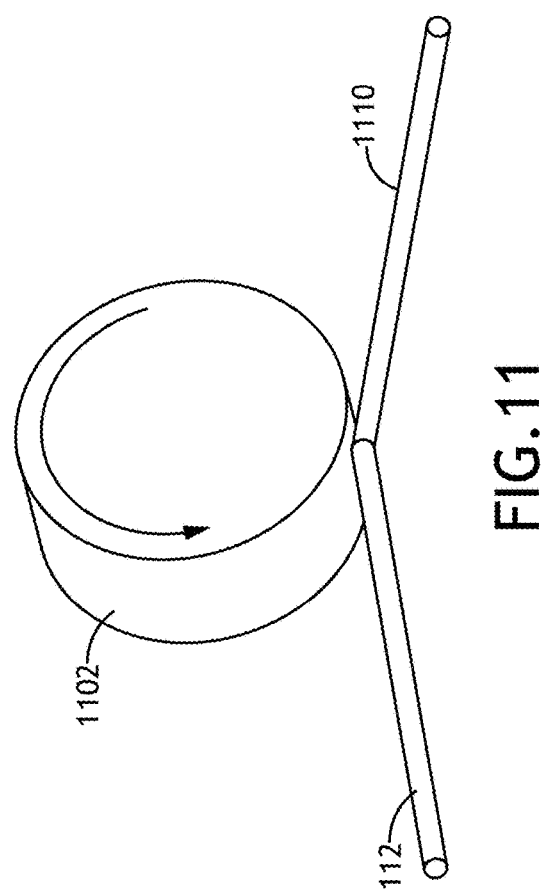
FIG. 11 shows a grazing incidence mirror configured for speckle breaking, in accordance with one or more embodiments of the present disclosure.

FIG. 11 shows a grazing incidence mirror 1102 configured to break the speckle pattern of the light beam 112. The grazing mirror 1102 is a rotating drum with a reflective surface. The speckle pattern in output light beam 1110 is mitigated after the incident light beam 112 is reflected off the grazing mirror 1102.

In some embodiments, the speckle pattern may be mitigated by reflecting the light off the surface of a liquid mirror. The liquid mirror may comprise a material in a liquid state that has sufficient EUV reflectivity. The liquid may be a eutectic metal alloy, or a suspension of nanoparticles in a liquid media. The liquid mirror may be rotated to create the desired optical surface, or vibrated to generate a standing wave pattern to generate a sufficient number of unique views to break the speckle pattern.

Figure 12:
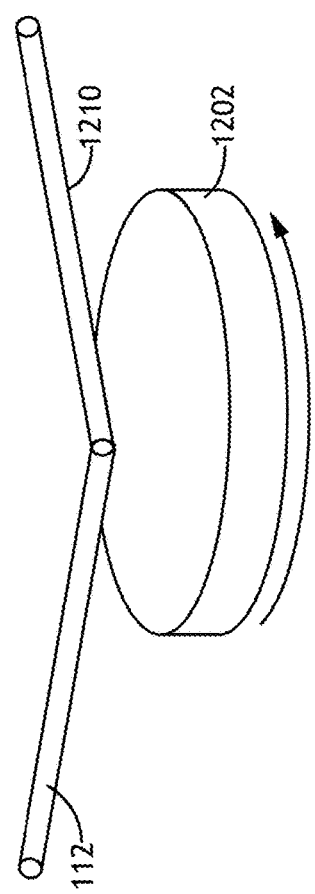
FIG. 12 shows a reflective surface configured for speckle breaking, in accordance with one or more embodiments of the present disclosure.

FIG. 12 shows a rotating mirror 1202 configured to break the speckle pattern of the light beam 112. The rotating mirror 1202 may comprise a solid or liquid reflective material. The speckle pattern in output light beam 1210 is mitigated after the incident light beam 112 is reflected off the rotating mirror 1202.

In some embodiments, the speckle pattern may be mitigated by transmitting the light through a region with gas flow. The gas may be at sufficient flow and pressure to produce sufficient spatial refraction of the EUV light. Pulsed or turbulent flow may be used to generate unique views to mitigate the speckle pattern.

In some embodiments, the speckle pattern may be mitigated by acousto-optics modulation, where a mechanical excitation in a material may generate waves in the material, spatiotemporally changing the material density, and thus the optical properties.

In some embodiments, MEMS-based digital micromirror devices (DMDs) may be used as speckle breaking surfaces, dynamic DOEs, and/or beam steering elements. The mirrors may be used in grazing incidence reflection, or in normal incident reflection geometry when coated with a multilayer mirror material. A dynamic random pattern may be generated on the DMD to create a diffusive DOE with changing views to break the speckle. Digital holography may be used to generate an arbitrary diffraction pattern from the DMD, which may include splitting and steering the incident beam. When coated with multilayer mirrors, DMDs may be used as programmable gratings or spatial light modulators with adjustable phase-shift. In grazing incidence geometry with pixel tilt mode, the DMDs may adjust the blazing angle of a grating and therefore improve diffraction efficiency.

In some embodiments, multilayer mirrors may be deposited onto a (back-thinned) membrane to produce a beam splitter with a distribution of transmitted and reflected power. This beam splitter may be used to distribute the light, or as a pickoff for power or beam monitoring.

In some embodiments, a beam splitter may be formed from a thin well-defined wedge, where a fraction of the light is reflected (e.g., in grazing incidence geometry) from one side of the wedge, and a fraction is transmitted or reflected from another side of the wedge. Such a wedge may be formed by anisotropic etching of a smooth silicon wafer of sufficient thickness (e.g., a few hundred microns) through a lithographically pre-defined window/opening. To improve (grazing incidence) EUV reflectivity of at least one surface of the wedge, the wafer may be coated with a layer of EUV reflecting material (e.g., molybdenum).

As described above, the etendue matching optics 312a-b (described with respect to FIG. 3) and etendue matching optics 412a-d (described with respect to FIG. 4) may directly manipulate the etendue of the light beam 112 in conjunction with, or in the absence of, the adaptive electron optics 109a-b.

In some embodiments, the etendue matching optics 312a-b and 412a-d may comprise temporal modulators, which use temporal methods to manipulate (e.g. increase) the etendue of the light beam 112, and thus match the etendue of the light beam 112 to the illumination pupil of the illumination optics 314a-b and 414a-d. Temporal methods may include using any method to steer a beam, including using fast steering mirrors (piezo or electromagnetic actuators), diffractive pointing, or a rotating set of mirrors.

Temporal methods involve rastering a low-etendue beam (e.g., light beam 112) over an illumination field or pupil aperture so that the time-averaged illumination simulates a beam with a larger etendue. This rastering may be realized by using a mirror (normal or grazing incidence) on an actuator to steer the source beam over a programmed area (e.g., "pupil painting"). The mirror actuation may be realized by, for example, a hexapod or voice coil actuator, or by using a DMD (see above). The steering is sufficiently fast that the source beam may fill the pupil, or steer over a discrete number of tiled sensors, over the integration time of the inspection system. The steering mirror may also be used to split the source beam to distribute the light power to multiple inspection systems.

Filling the illumination pupil or field (e.g., matching etendue of illumination optics 314a-b and 414a-d) in the temporal domain may also be realized by spinning a set of mirrors on a single mount, so that each reflection points to a different focal position. The spinning mirror may also be a continuous surface with a variable focal position across the surface of the spinning element. Additionally, the spinning mirror may split the source beam to distribute the light power to multiple inspection sub-systems (e.g., subsystems 310a-b and 410a-d).

Figure 13B:
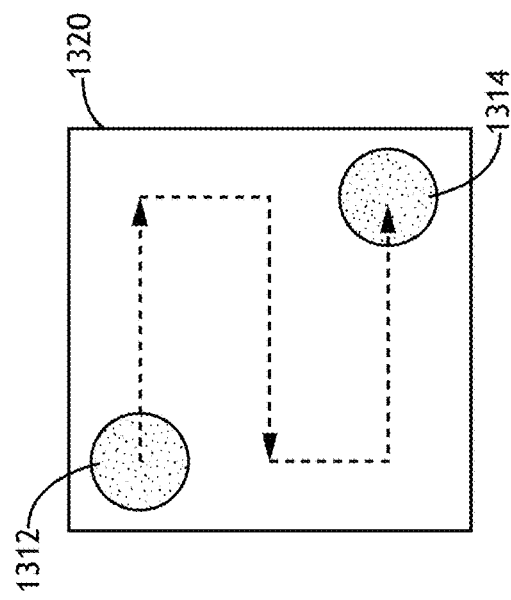
FIG. 13B shows the path of a light beam reflected by the mirror shown in FIG. 13A, in accordance with one or more embodiments of the present disclosure.
Figure 13A:
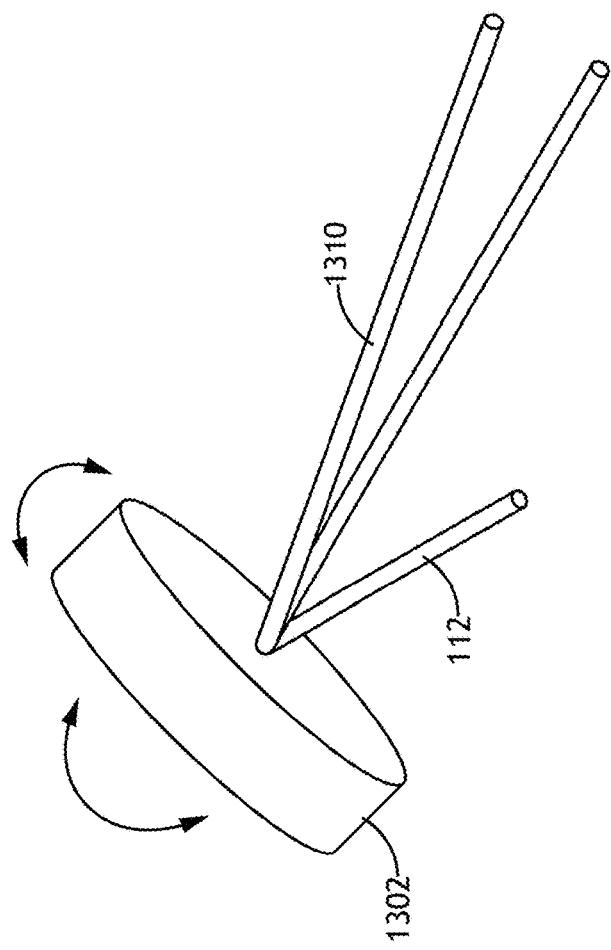
FIG. 13A shows an actuatable steering mirror configured for etendue matching, in accordance with one or more embodiments of the present disclosure.

FIG. 13A shows a temporal modulator comprising an actuatable steering mirror 1302 configured to match (e.g., increase) the etendue of the light beam 112 to the etendue of a set of illumination optics by filling illumination pupil (or field) 1320. The input light beam 112 is incident on the steering mirror 1302 and the output light beam 1310 is rastered over the illumination pupil (or field) 1320. FIG. 13B shows a path the output light beam 1310 may take when rastered over the illumination pupil (or field) 1320, starting at a first point 1312 and ending at a second point 1314.

Figure 14:
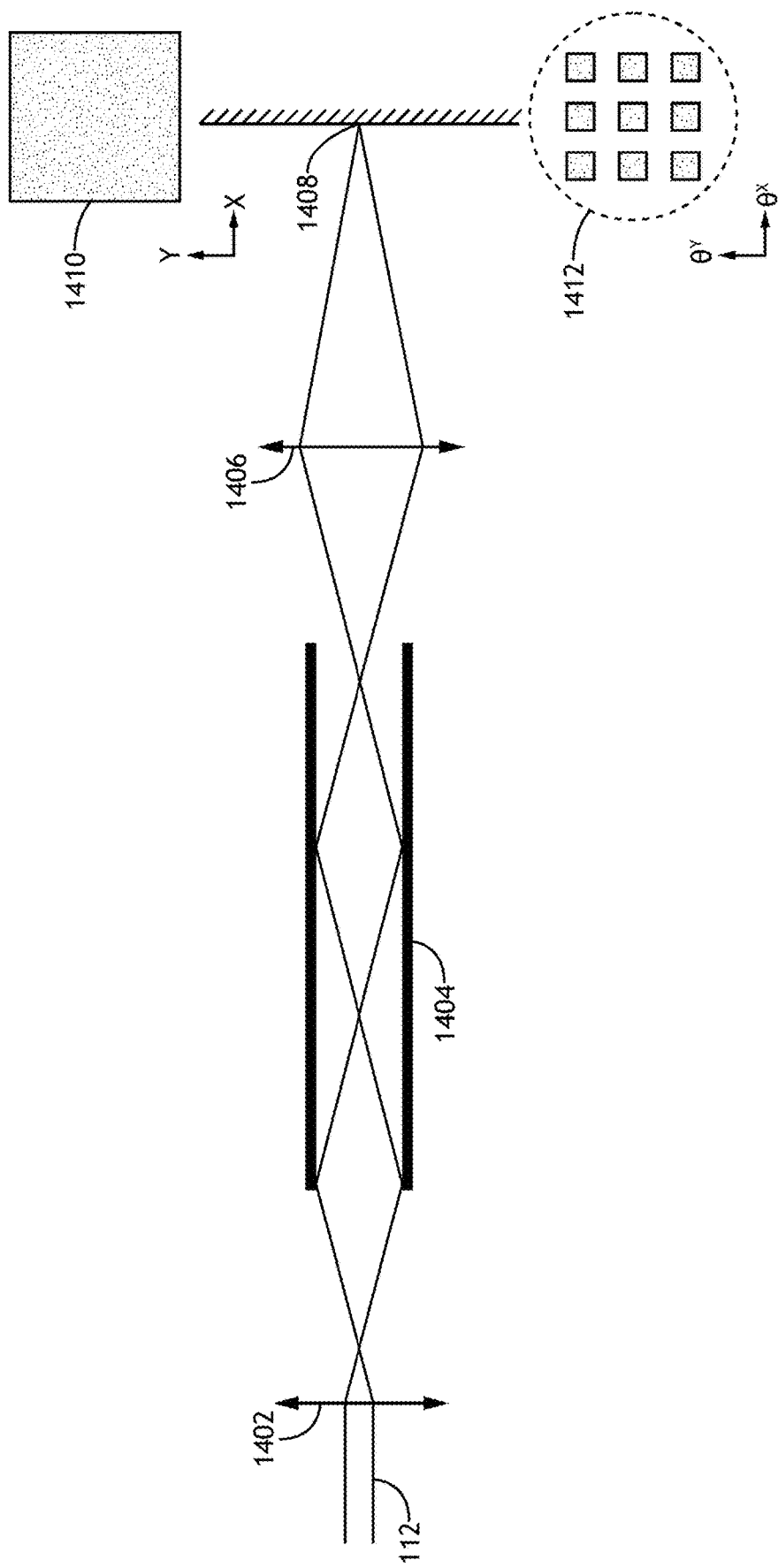
FIG. 14 is a schematic view of a beam homogenizer, in accordance with one or more embodiments of the present disclosure.

FIG. 14 is a schematic view of a hollow optical waveguide 1404 configured to homogenize the output light beam 112 and match the etendue of the light beam 112 to a set of illumination optics (e.g., illumination optics 314a-b and 414a-d). The inner surface of the waveguide 1404 is reflective for EUV light. The waveguide 1404 may comprise grazing incidence mirrors and may have a cross-section of different shapes (e.g., a square cross-section). Using a set of waveguide matching optics 1402, the light beam 112 is focused onto a first end (input) of the waveguide 1404 so that the divergence angle after the focus fills the angular space to match a required numerical aperture (NA). The light 112 is reflected multiple times inside the waveguide 1404. A second end (output) of the waveguide 1404 is imaged (focused) onto the mask or wafer 1408 (e.g., mask or wafer 316a-b or 416a-b) using a set of illumination optics 1406 (e.g., illumination optics 314a-b or 414a-d). The spatial irradiance at the mask or wafer 1408 is represented by a homogenized illumination field 1410 of a desired (e.g., square) shape. In angular space, the radiant intensity is a repeated pattern 1412 of the source beam 112 resulting in a structured pupil fill.

An Exemplary Beam Delivery System with Etendue Matching Optics

In one embodiment, two grazing incidence mirrors and a multilayer mirror with a diffractive optical element may be used split and guide a light beam from a sub-fab (e.g., a synchrotron) to an optical characterization sub-system (e.g., a mask or wafer inspection tool). The light beam is coupled into the sub-system's illumination optics, spectral filtering optics, and etendue matching optics. The light beam may be incident on the grazing incidence mirrors at an angle of incidence of 20 degrees, and one of the grazing incidence mirrors may be combined with a grating in an out-of-plane configuration for beam-splitting.

The transmission efficiency of such a beam delivery system may be about 10-20%. After consideration of all losses (including the inspection system's optics), a source power of about 140 mW and a brightness of about 60 W/mm²/sr are required for actinic inspection of EUV masks. A total power of about 600 mW may be required for four inspection tools. A similar brightness and a lower source power (1 mW) are required for a defect review tool. These specifications are realizable with a synchrotron-based compact radiation sources. With further optimization of beam delivery and illumination optics, an improvement factor of about 2-3 is possible.

Figure 15:
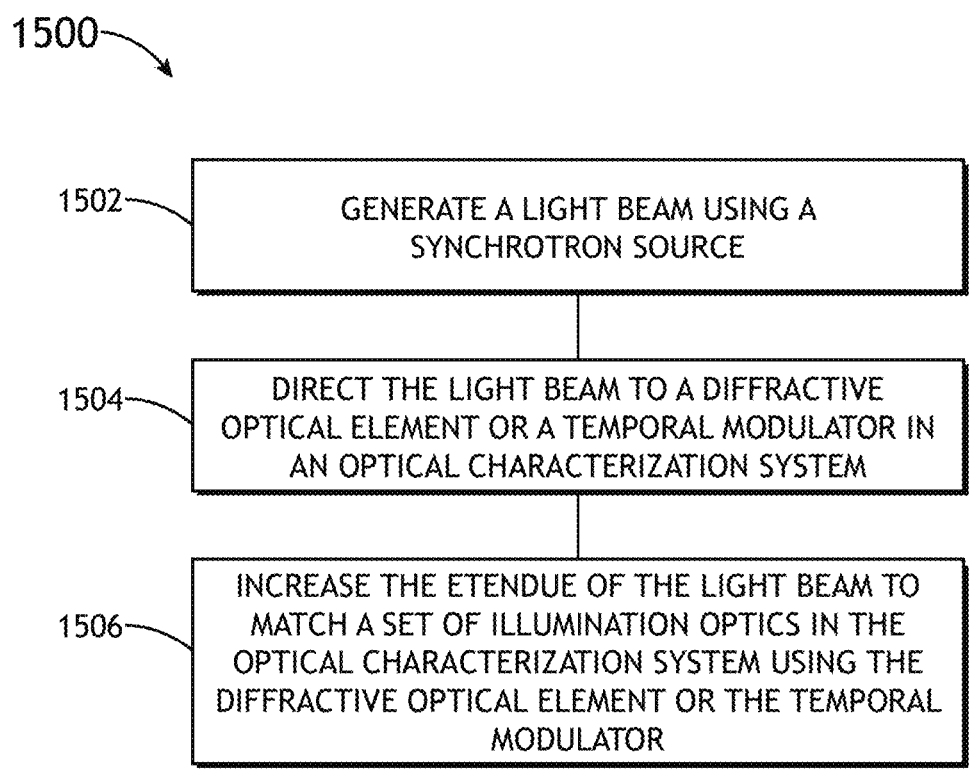
FIG. 15 is a flowchart showing a method of matching an etendue of a light beam in an optical characterization system, in accordance with one or more embodiments of the present disclosure.

An Exemplary Method of Matching an Etendue of a Light Beam in an Optical Characterization System FIG. 15 is a flowchart 1500 showing a method of matching an etendue of a light beam in an optical characterization system.

At step 1502, a light beam is generated using a wiggler synchrotron source. The light beam may be, for example, the light beam 112 generated by the wiggler synchrotron source 100. One or more wiggler insertion devices may generate the light beam by accelerating the electrons passing through a gap between the top portion and bottom portion of a given wiggler insertion device periodically along a direction perpendicular to the direction of travel of the electrons.

At step 1504, the light beam is directed to a diffractive optical element or a temporal modulator or a homogenizing optical waveguide in an optical characterization system (e.g., one of the optical characterization subsystems 410*a-d*). After the light beam exits the wiggler synchrotron, beam delivery optics (e.g., beam delivery optics 401*a-b*) may distribute the light beam to the optical characterization sub-systems. The beam delivery optics may include beam steering optics (e.g., mirrors, beam splitters, lenses and the like) configured to direct the light beam from the synchrotron source to the diffractive optical element or the temporal modulator or the homogenizing optical waveguide (e.g., one of the etendue matching optics 412*a-d*). The beam steering optics may include a set of relay mirrors suitable for directing light from the synchrotron source 100 to the diffractive optical element or the temporal modulator or the homogenizing optical waveguide. The beam delivery optics may include spectral filtering optics, e.g. one or more diffraction gratings configured to transmit or direct selected wavelength bands of the light beam. The spectral filtering optics or a diffraction grating may be used to select the centroid wavelength. The use of the centroid wavelength in the inspection (or review) process may lead to improved accuracy of defect printability estimation.

At step 1506, the etendue of the light beam is matched to a set of illumination optics in the optical characterization system using the diffractive optical element or the temporal modulator or the homogenizing optical waveguide.

Diffractive optical elements (DOEs) are surface structures patterned onto a transmissive or reflective optical element. The pattern spatially modulates the phase and/or amplitude of an optical wave. DOEs may be patterned onto the substrate of a reflective EUV mirror (normal or grazing incidence), patterned into the multilayer (ML) of a reflective mirror, or patterned onto a transmissive thin-film. The diffractive pattern may be binary (e.g., structure height determined by etch depth), gray-scale (more than one step height), or blazed (triangular angled feature), or exhibit other more complex height profiles.

Temporal modulators use temporal methods to match the etendue of the light beam to the illumination pupil of the illumination optics. Temporal methods may include using any method to steer a beam, including using fast steering mirrors (piezo or electromagnetic actuators), diffractive pointing, or a rotating set of mirrors. Temporal methods involve rastering the low-etendue light beam over an illumination field or pupil aperture so that the time-averaged illumination simulates a beam with a larger etendue. This rastering may be realized by using a mirror (normal or grazing incidence) on an actuator to steer the source beam over a programmed area (e.g., "pupil painting"). The steering is sufficiently fast that the source beam may fill the pupil, or steer over a discrete number of tiled sensors, over the integration time of the inspection system. Diffractive optical elements and temporal modulators are further described with respect to FIGS. 5-14.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An optical characterization system comprising:
   a synchrotron source;
   an optical characterization sub-system including at least:
      a set of illumination optics,
      a set of imaging optics, and
      a diffractive optical element configured to match an etendue of a light beam output by the synchrotron source to the set of illumination optics; and
   a sensor configured to receive a projected image from the set of imaging optics.

2. The optical characterization system of claim 1, wherein the optical characterization system comprises at least one of an actinic EUV mask inspection system, a wafer inspection or metrology system, an actinic mask review system or an EUV mask reflectometer system.

3. The optical characterization system of claim 1, wherein the diffractive optical element includes an optical surface.

4. The optical characterization system of claim 3, wherein the optical surface is a one-dimensional regular pattern or a two-dimensional regular pattern.

5. The optical characterization system of claim 3, wherein the optical surface is a random pattern with a programmed size distribution.

6. The optical characterization system of claim 5, wherein the random pattern comprises nanoparticles.

7. The optical characterization system of claim 5, wherein the random pattern comprises a block-copolymer.

8. The optical characterization system of claim 3, wherein the optical surface comprises a programmed hologram pattern.

9. The optical characterization system of claim 8, wherein the programmed hologram pattern is generated from a projected pattern by computing an inverse of a diffraction pattern.

10. The optical characterization system of claim 8, wherein the programmed hologram pattern is at least one of continuous pattern, a binary pattern, or a gray-scale approximation.

11. The optical characterization system of claim 1, wherein the optical characterization sub-system includes a rotating surface configured to break a speckle pattern of the light beam.

12. The optical characterization system of claim 11, wherein the rotating surface comprises a grazing incidence mirror with a reflective surface.

13. The optical characterization system of claim 11, wherein the rotating surface comprises a eutectic metal alloy or a suspension of nanoparticles in a liquid media.

14. The optical characterization system of claim 1, wherein the synchrotron source comprises a set of adaptive electron optics.

15. The optical characterization system of claim 14, wherein the set of adaptive electron optics is configured to match the etendue of the light beam to the set of illumination optics.

16. The optical characterization system of claim 14, wherein the synchrotron source comprises a wiggler synchrotron source.

17. The optical characterization system of claim 1, wherein the optical characterization sub-system includes at least one of a galvanometric actuator, piezo actuator, or motor actuator configured to break a speckle pattern of the light beam by vibrating the diffractive optical element.

18. The optical characterization system of claim 1, wherein the optical characterization sub-system includes an acousto-optic modulator configured to break a speckle pattern of the light beam.

19. An optical characterization system comprising:
    a synchrotron source;
    an optical characterization sub-system including at least:
       a set of illumination optics,
       a set of imaging optics, and
       a temporal modulator configured to match an etendue of a light beam output by the synchrotron source to the set of illumination optics; and
    a sensor configured to receive a projected image from the set of imaging optics.

20. The optical characterization system of claim 19, wherein the temporal modulator comprises an actuatable steering mirror.

21. The optical characterization system of claim 20, wherein the actuatable steering mirror is configured to steer the light beam over an illumination pupil of the set of illumination optics.

22. The optical characterization system of claim 20, wherein the actuatable steering mirror is configured to steer the light beam over an illumination field of the set of illumination optics.

23. The optical characterization system of claim 20, wherein a hexapod actuator or a voice coil actuator is configured to actuate the actuatable steering mirror.

24. The optical characterization system of claim 19, wherein the synchrotron source comprises a set of adaptive electron optics.

25. The optical characterization system of claim 24, wherein the set of adaptive electron optics is configured to match the etendue of the light beam to the set of illumination optics.

26. The optical characterization system of claim 19, wherein the optical characterization sub-system includes an acousto-optic modulator configured to break a speckle pattern of the light beam.

27. An optical characterization system comprising:
    a synchrotron source;
    an optical characterization sub-system including at least:
       a set of illumination optics,
       a set of imaging optics, and
       an optical waveguide configured to match an etendue of a light beam output by the synchrotron source to the set of illumination optics; and
    a sensor configured to receive a projected image from the set of imaging optics.

28. A method of matching an etendue of a light beam in an optical characterization system, comprising:
   generating the light beam using a synchrotron source;
   directing the light beam to a diffractive optical element or a temporal modulator; and
   increasing the etendue of the light beam to match a set of illumination optics using the diffractive optical element or the temporal modulator.

29. The method of claim 28, wherein the optical characterization system comprises at least one of an actinic EUV mask inspection system, a wafer inspection or metrology system, an actinic mask review system or an EUV mask reflectometer system.

30. The method of claim 28, wherein the diffractive optical element includes an optical surface.

31. The method of claim 30, wherein the optical surface is a one-dimensional regular pattern or a two-dimensional regular pattern.

32. The method of claim 30, wherein the optical surface is a random pattern with a programmed size distribution.

33. The method of claim 32, wherein the random pattern comprises nanoparticles.

34. The method of claim 32, wherein the random pattern comprises a block-copolymer.

35. The method of claim 30, wherein the optical surface comprises a programmed hologram pattern.

36. The method of claim 35, wherein the programmed hologram pattern is generated from a projected pattern by computing an inverse of a diffraction pattern.

37. The method of claim 35, wherein the programmed hologram pattern is at least one of continuous pattern, a binary pattern, or a gray-scale approximation.

* * * * *